(12) United States Patent
Chang et al.

(10) Patent No.: US 12,279,180 B2
(45) Date of Patent: Apr. 15, 2025

(54) METHOD FOR PROCESSING DATA USED FOR LOCATION DETERMINATION AND ELECTRONIC DEVICE SUPPORTING SAME

(71) Applicant: Samsung Electronics Co., Ltd., Suwon-si (KR)

(72) Inventors: Dukhyun Chang, Suwon-si (KR); Taeyoon Kim, Suwon-si (KR); Youngpo Lee, Suwon-si (KR); Hyeonggeon Lee, Suwon-si (KR); Hyoungjoo Lee, Suwon-si (KR); Chaeman Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 421 days.

(21) Appl. No.: 17/940,589

(22) Filed: Sep. 8, 2022

(65) Prior Publication Data

US 2023/0007442 A1    Jan. 5, 2023

Related U.S. Application Data

(63) Continuation of application No. PCT/KR2021/002909, filed on Mar. 9, 2021.

(30) Foreign Application Priority Data

Mar. 9, 2020   (KR) .................. 10-2020-0029155

(51) Int. Cl.
*H04W 24/00*    (2009.01)
*G01R 33/12*    (2006.01)
(Continued)

(52) U.S. Cl.
CPC ............ *H04W 4/029* (2018.02); *G01R 33/12* (2013.01); *H04W 4/027* (2013.01); *H04W 4/33* (2018.02); *H04W 4/38* (2018.02)

(58) Field of Classification Search
CPC ......... H04W 4/029; H04W 4/38; H04W 4/33; H04W 4/027; G01R 33/12
(Continued)

(56) References Cited

U.S. PATENT DOCUMENTS 9,151,823 B2    10/2015  Lu et al.
2012/0006112 A1   1/2012  Lee et al.
(Continued)

FOREIGN PATENT DOCUMENTS

KR    10-2012-0005701 A    1/2012
KR    10-2016-0004084 A    1/2016
(Continued)

OTHER PUBLICATIONS

Le Grand et al., "3-Axis Magnetic Field Mapping and Fusion for Indoor Localization," 2012 IEEE International Conference on Multisensor Fusion and Integration for Intelligent Systems (MFI), Sep. 13-15, 2012; Stanford University; Hamburg, Germany.
(Continued)

*Primary Examiner* — Temica M Beamer
(74) *Attorney, Agent, or Firm* — Jefferson IP Law, LLP

(57) ABSTRACT

An electronic device is provided. The electronic device includes a magnetic sensor, an acceleration sensor, and a processor operatively connected to the magnetic sensor and the acceleration sensor, wherein the processor is configured to acquire multiple pieces of first magnetic data by using the magnetic sensor in a first area where the electronic device is located, generate a virtual marker corresponding to the first area by using the multiple pieces of first magnetic data, determine the movement of the electronic device on the basis of multiple pieces of first acceleration data in a first direction, the data being acquired by using the acceleration sensor, determine the posture of the electronic device on the basis of multiple pieces of second acceleration data in a
(Continued)

second direction that is perpendicular to the first direction, the data being acquired by using the acceleration sensor, and determine, on the basis of at least one of the movement of the electronic device and the posture of the electronic device, multiple pieces of third magnetic data to be used for comparison with the virtual marker, among multiple pieces of second magnetic data acquired within a designated radius with reference to the first area by using the magnetic sensor.

20 Claims, 20 Drawing Sheets

(51) Int. Cl.
*H04W 4/02* (2018.01)
*H04W 4/029* (2018.01)
*H04W 4/33* (2018.01)
*H04W 4/38* (2018.01)

(58) Field of Classification Search
USPC ...................................................... 455/456.3
See application file for complete search history.

(56) References Cited

U.S. PATENT DOCUMENTS

| | | |
|---|---|---|
| 2013/0311084 A1 | 11/2013 | Lundquist et al. |
| 2014/0286534 A1 | 9/2014 | Haverinen |
| 2016/0116290 A1 | 4/2016 | Haverinen et al. |
| 2016/0223340 A1 | 8/2016 | Shin et al. |
| 2021/0123746 A1 | 4/2021 | Chang et al. |
| 2021/0211839 A1 | 7/2021 | Lee et al. |

FOREIGN PATENT DOCUMENTS

| | | |
|---|---|---|
| KR | 10-1933011 A | 12/2018 |
| KR | 10-2021-0049521 A | 5/2021 |
| KR | 10-2021-0067607 A | 6/2021 |
| KR | 10-2021-0087181 A | 7/2021 |
| WO | 2014/100298 A2 | 6/2014 |

OTHER PUBLICATIONS

Galvan-Tejada et al., "Magnetic Field Feature Extraction and Selection for Indoor Location Estimation," Sensors 2014, 14, 11001-11015; doi:10.3390/s140611001; ISSN 1424-8220; Jun. 20, 2014.
Saxena et al., "Indoor Positioning System Using Geo-Magnetic Field", 978-1-4673-6386-0/14 © 2014 IEEE.
Chung et al., "Indoor Location Sensing Using Geo-Magnetism", MobiSys'11, Jun. 28-Jul. 1, 2011, Bethesda, Maryland, USA. Copyright 2011 ACM 978-1-4503-0643-0/11/06.

| One-dimensional virtual marker 510 | | | |
|---|---|---|---|
| Sampling Rate | Length | | |
| Timestamp 1 | MagX$_1$ | MagY$_1$ | MagZ$_1$ |
| : | : | : | : |
| Timestamp N | MagX$_N$ | MagY$_N$ | MagZ$_N$ |
| Sampling Rate | Length | | |
| Timestamp 1 | AccX$_1$ | AccY$_1$ | AccZ$_1$ |
| : | : | : | : |
| Timestamp N | AccX$_N$ | AccY$_N$ | AccZ$_N$ |
| Sampling Rate | Length | | |
| Timestamp 1 | Roll$_1$ | Pitch$_1$ | Yaw$_1$ |
| : | : | : | : |
| Timestamp N | Roll$_N$ | Pitch$_N$ | Yaw$_N$ |
| Number of WLAN Aps | | | |
| AP1 signal strength | . . . | | APN signal strength |
| Number of Cell Number | | | |
| Cell1 signal strength | . . . | | CellN signal strength |

- Magnetic sensign values 520
- Accelerometer sensign values 530
- Gyroscope sensign values 540
- WiFi signals 550
- Cellular signals 560

FIG.5

| Second-dimensional virtual marker cell 610 | | | |
|---|---|---|---|
| MagX | MagY | MagZ | |
| AccX₁ | AccY₁ | AccZ₁ | |
| Roll | Pitch | Yaw | |
| Number of WLAN Aps | | | |
| AP1 signal strength | ... | APN signal strength | |
| Number of Cell Number | | | |
| Cell1 signal strength | ... | CellN signal strength | |

- Magnetic sensign values 620
- Accelerometer sensign values 630
- Gyroscope sensign values 640
- WiFi signals 650
- Cellular signals 660

615:

| -1.62 | -2.812 | -.54 | -1.73 | -1.54 | -3.1064 | -1 | -1.905 | -1.8227 | -1.4927 | -3.473 |
| -0.776 | -3.28 | -1.04 | -2.12 | -0.9467 | -3.3477 | -0.485 | -1.01 | -2.1852 | -1.27 | -2.0667 |
| -1.2 | -3.2 | -0.0886 | -0.3 | -0.536 | -4.085 | -0.224 | 0 | -2.3787 | -1.8886 | -1.33 |
| -2.435 | -3.17 | -1.14 | 0 | -1.7764 | -4.02 | -0.872 | -2.1467 | -2.3686 | -2.7 | -1.78 |
| -4.184 | -3.34 | -2.72 | 0 | -2.328 | -3.0286 | -1.78 | -2.36 | -2.16 | -2.78 | -2.4725 |
| -4.3509 | -2.3733 | -4.196 | -2.552 | -4.0325 | -2.8182 | -4.3618 | -3.2675 | -3.44 | -3.3114 | -3.245 |
| -5.45 | -3.6662 | -4.2067 | -3.416 | -3.4775 | -3.086 | -5.0343 | -4.27 | -4.7975 | -3.675 | -3.245 |
| -5.4 | -6.16 | -5.42 | -4.268 | -2.54 | -3.2857 | -5.48 | -4.445 | -4.8971 | -5.165 | -3.48 |
| -4.92 | -5.56 | -5.195 | -4.13 | -2.36 | -3.5771 | -5.85 | -4.595 | -5.49 | -5.852 | -3.9029 |
| -4.84 | -5 | -4.13 | -3.308 | -2.86 | -4.2114 | -6.0667 | -5.564 | -6.2086 | -6.37 | -5.06 |
| -5.14 | -4.955 | -3.2164 | -4.98 | -6.0629 | -5.264 | -4.952 | -6.18 | -7.02 | -6.8771 | -6.2857 |
| -5.7029 | -5.4575 | -5.2014 | -5.125 | -5.114 | -5.3 | -4.756 | -7.8659 | -7.96 | -8.42 | -8 |

FIG.6

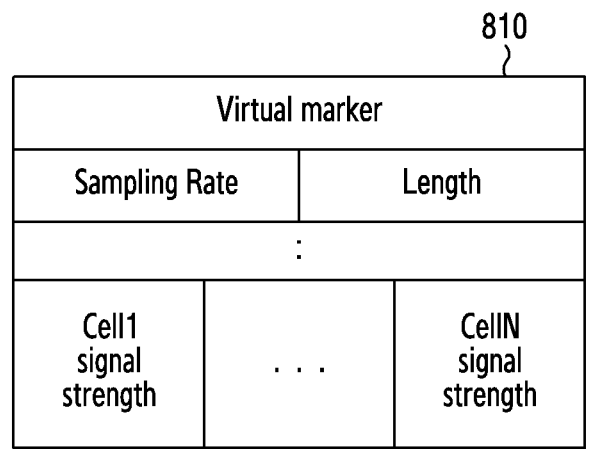
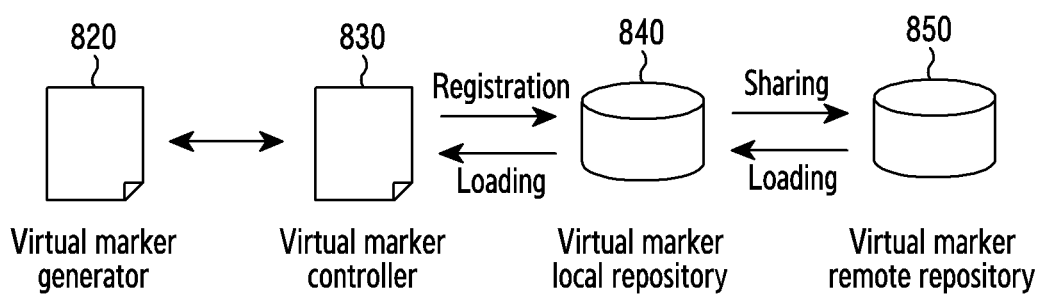
FIG.8

METHOD FOR PROCESSING DATA USED FOR LOCATION DETERMINATION AND ELECTRONIC DEVICE SUPPORTING SAME

CROSS-REFERENCE TO RELATED APPLICATION(S)

This application is a continuation application, claiming priority under § 365(c), of an International application No. PCT/KR2021/002909, filed on Mar. 9, 2021, which is based on and claims the benefit of a Korean patent application number 10-2020-0029155, filed on Mar. 9, 2020, in the Korean Intellectual Property Office, the disclosure of which is incorporated by reference herein in its entirety.

BACKGROUND

1. Field

The disclosure relates to a method for processing data used for location determination, and an electronic device supporting same.

2. Description of Related Art

In tracking the location of an electronic device in an indoor space, the electronic device may use magnetic data, the value of which is distorted by a magnetic characteristic of a steel frame or a steel structure related to the indoor space. For example, the electronic device may record magnetic data measured at a particular location of the indoor space as a feature point of the particular location, and determine the similarity between magnetic data measured at a predetermined location and the feature point recorded with respect to the corresponding position, so as to track the location of the electronic device.

The above information is presented as background information only to assist with an understanding of the disclosure. No determination has been made, and no assertion is made, as to whether any of the above might be applicable as prior art with regard to the disclosure.

SUMMARY

According to a motion (e.g., arm swing) of the body of a user holding an electronic device, the electronic device may be repeatedly moved and stopped, and measure, based on a time period related to data measurement at the location of the stop, multiple pieces of data, at least some of which have different values. However, the multiple pieces of data measured at the location at which the electronic device stops need to be considered as a single piece of data indicating a data characteristic of the location at which the electronic device stops, for comparison with a feature point recorded at the corresponding location, and thus separate processing of the multiple pieces of data may be required.

Aspects of the disclosure are to address at least the above-mentioned problems and/or disadvantages and to provide at least the advantages described below. Accordingly, an aspect of the disclosure is to provide a method for data processing used for location determination, and an electronic device supporting same, wherein comparison with a recorded feature point may be supported with high reliability through processing of multiple pieces of data measured as the electronic device moves, based on moving and stopping of the electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a magnetic sensor, an acceleration sensor, and a processor operatively connected to the magnetic sensor and the acceleration sensor.

According to an embodiment, the processor may acquire multiple pieces of first magnetic data by using the magnetic sensor in a first area where the electronic device is located, generate a virtual marker corresponding to the first area by using the multiple pieces of first magnetic data, determine a movement of the electronic device, based on multiple pieces of first acceleration data in a first direction, the data being acquired by using the acceleration sensor, determine a posture of the electronic device, based on multiple pieces of second acceleration data in a second direction that is perpendicular to the first direction, the data being acquired by using the acceleration sensor, and determine, based on at least one of the movement of the electronic device and the posture of the electronic device, multiple pieces of third magnetic data to be used for comparison with the virtual marker, among multiple pieces of second magnetic data acquired within a designated radius with reference to the first area by using the magnetic sensor.

In accordance with another aspect of the disclosure, a method for processing data used for location determination of an electronic device is provided. The method includes acquiring multiple pieces of first magnetic data by using a magnetic sensor in a first area where the electronic device is located, generating a virtual marker corresponding to the first area by using the multiple pieces of first magnetic data, determining a movement of the electronic device, based on multiple pieces of first acceleration data in a first direction, the data being acquired by using an acceleration sensor, determining a posture of the electronic device, based on multiple pieces of second acceleration data in a second direction that is perpendicular to the first direction, the data being acquired by using the acceleration sensor, and determining, based on at least one of the movement of the electronic device and the posture of the electronic device, multiple pieces of third magnetic data to be used for comparison with the virtual marker, among multiple pieces of second magnetic data acquired within a designated radius with reference to the first area by using the magnetic sensor.

According to various embodiments, some pieces of data to be used for comparison with a feature point corresponding to a particular location, among multiple pieces of data measured while an electronic device moves, may be specified based on moving and stopping of the electronic device, and thus the reliability of location tracking of the electronic device can be enhanced.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 illustrates a one-dimensional virtual marker defined for an indoor space by an electronic device according to an embodiment of the disclosure;

FIG. 6 illustrates a two-dimensional virtual marker defined for an indoor space by an electronic device according to an embodiment of the disclosure;

FIG. 8 illustrates the form of registration and loading of a virtual marker of an electronic device according to an embodiment of the disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
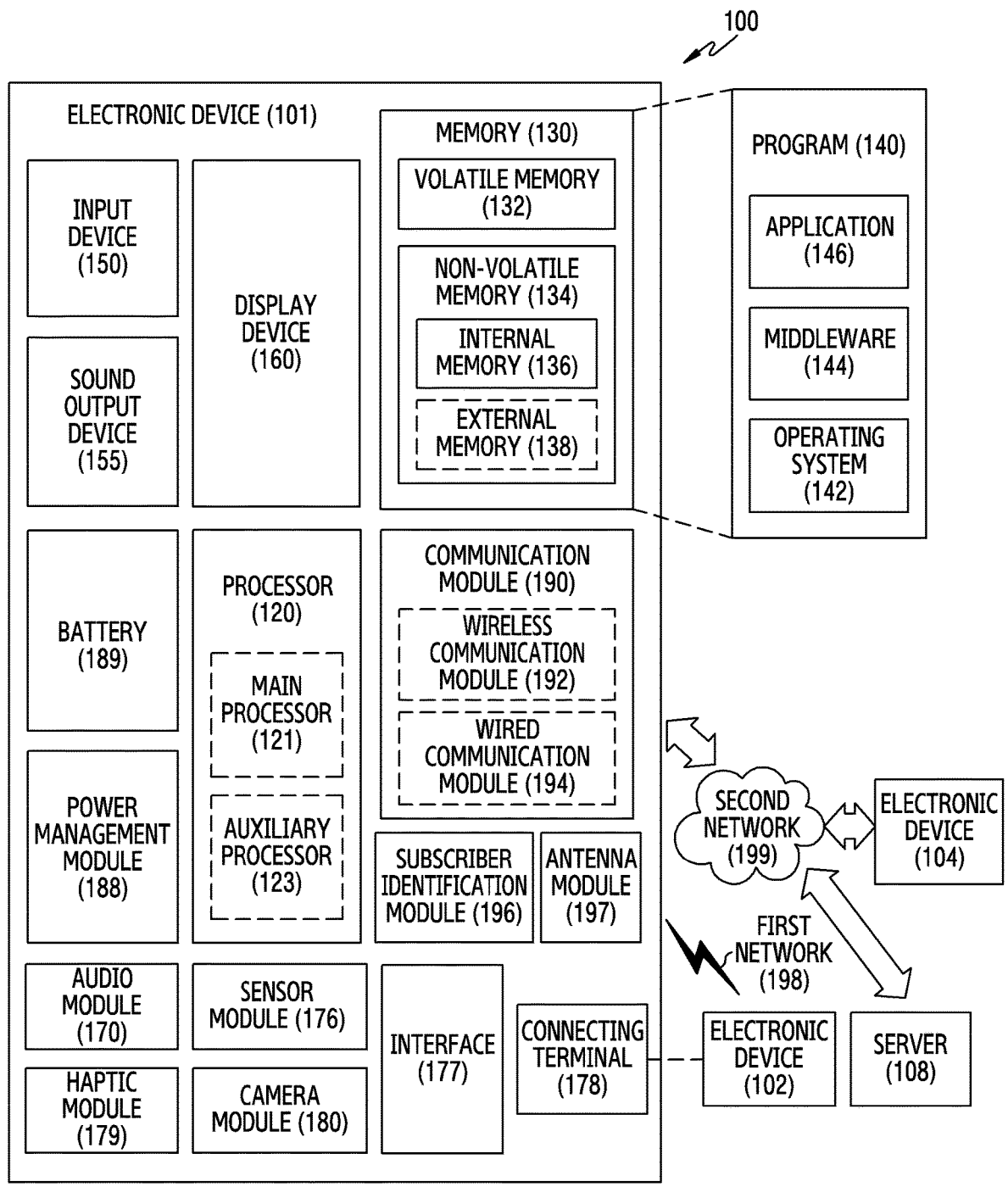
FIG. 1 illustrates an electronic device in a network environment according to an embodiment of the disclosure.

FIG. 1 illustrates an electronic device in a network environment according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102 and 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
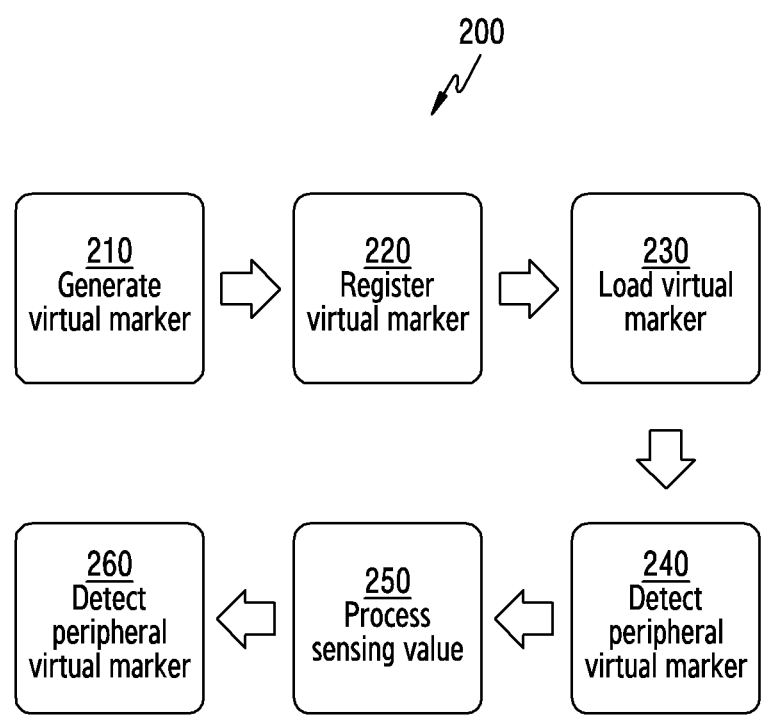
FIG. 2 illustrates a virtual marker operating process of an electronic device according to an embodiment of the disclosure.

FIG. 2 illustrates a virtual marker operating process of an electronic device according to an embodiment of the disclosure.

In an embodiment, a processor (e.g., the processor 120 of FIG. 1) of an electronic device (e.g., the electronic device 101 of FIG. 1) may determine the location (or an area where the electronic device 101 is located, or a path where the electronic device 101 is located) of the electronic device 101 in a designated indoor space (e.g., an indoor space configured by the electronic device 101 through an application supporting a location-based service). The processor 120 may generate a virtual marker indicating a data characteristic of at least one of a particular location, a particular area, and a particular path in the indoor space, and determine the location of the electronic device 101 by using the virtual marker.

Hereinafter, various embodiments relating to a virtual marker operating process 200 of the electronic device 101 will be described with reference to FIG. 2 and other drawings.

Figure 3:
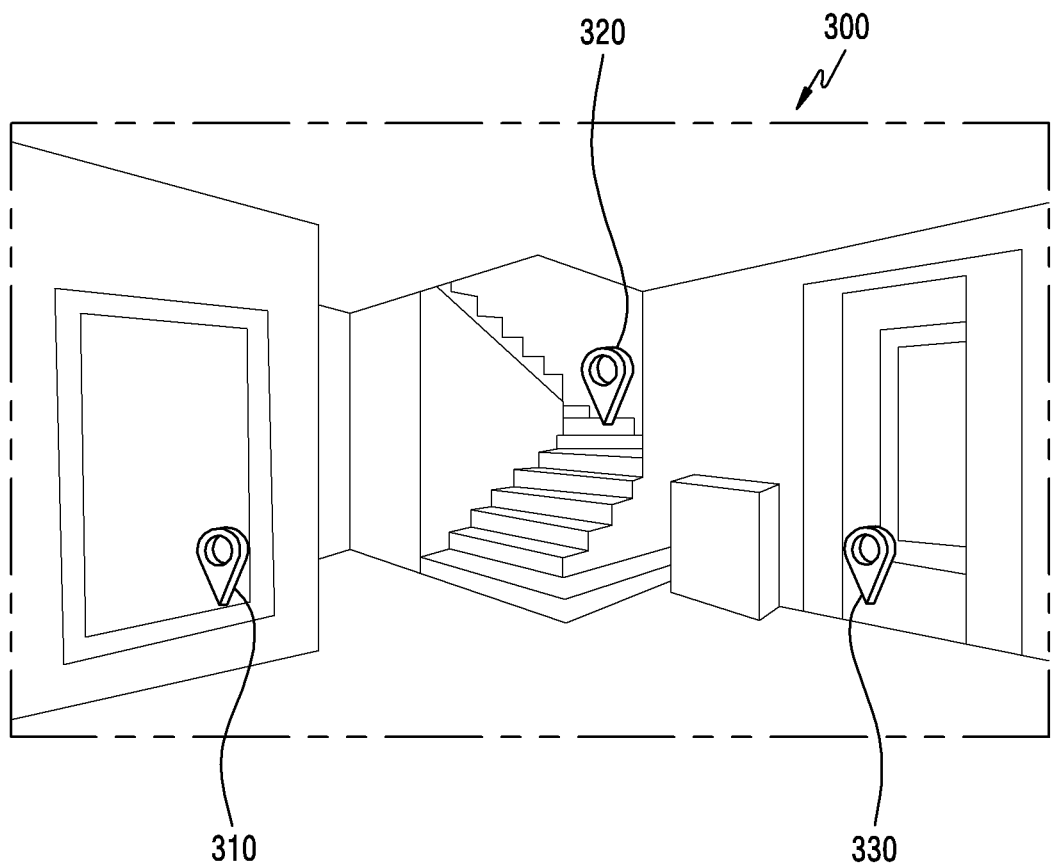
FIG. 3 illustrates an example in which an electronic device defines a virtual marker with respect to an indoor space according to an embodiment of the disclosure.

FIG. 3 illustrates an example in which an electronic device defines a virtual marker with respect to an indoor space according to an embodiment of the disclosure.

Figure 4:
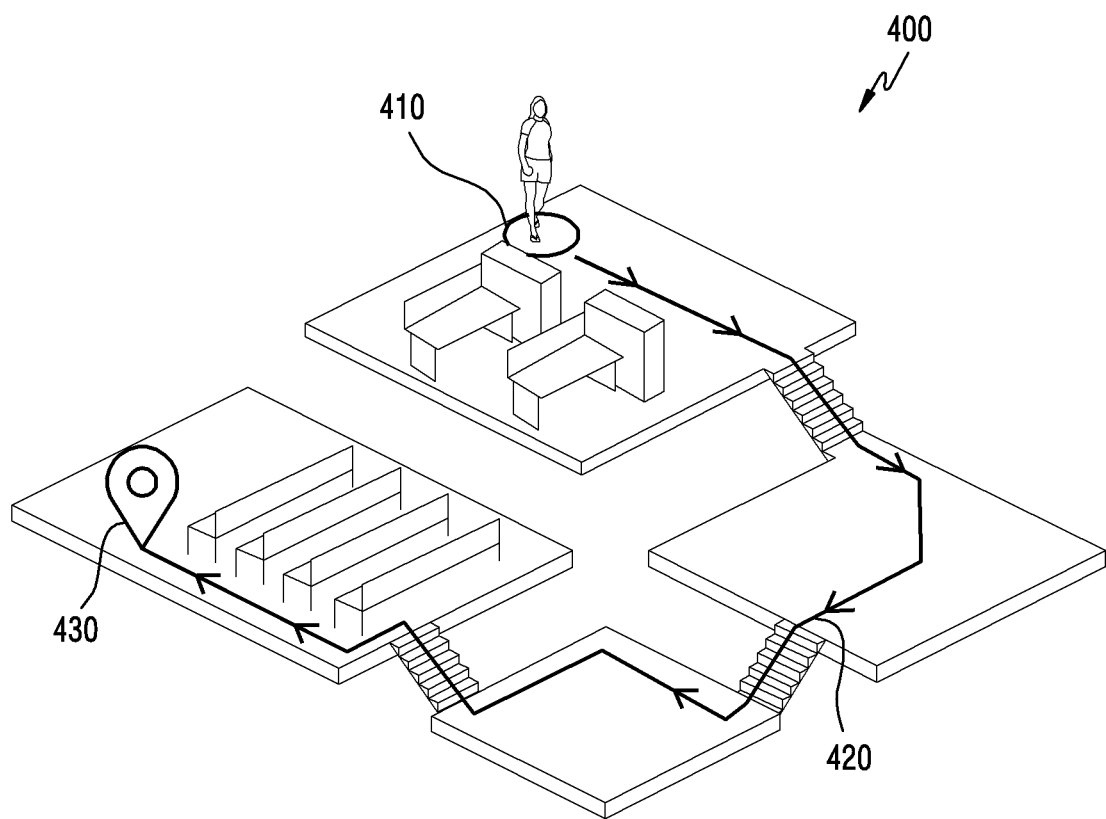
FIG. 4 illustrates another example in which an electronic device defines a virtual marker with respect to an indoor space according to an embodiment of the disclosure.

FIG. 4 illustrates another example in which an electronic device defines a virtual marker with respect to an indoor space according to an embodiment of the disclosure.

Referring to FIGS. 2, 3, and 4, a processor (e.g., the processor 120 of FIG. 1) of an electronic device (e.g., the electronic device 101 of FIG. 1) according to an embodiment may perform an operation of virtual marker generation 210. For example, the processor 120 may generate a virtual marker corresponding to an area where the electronic device 101 is located by using a magnetic sensing value, an acceleration sensing value, a gyro sensing value, a first wireless communication signal, and/or a second wireless communication signal, which are measured in the area where the electronic device 101 is located.

In an embodiment, the virtual marker may be data corresponding to a designated indoor space 300. For example, a virtual marker 310, 320, and/or 330 may be data corresponding to a small area within a designated first-size range, a detailed location, and/or a short path within a designated first-length range, in the indoor space 300. The virtual marker 310, 320, and/or 330 may be stored in a memory (e.g., the memory 130 of FIG. 1) of the electronic device 101. The virtual marker 310, 320, and/or 330 may include a magnetic sensing value, an acceleration sensing value, a gyro sensing value, a first wireless communication signal (e.g., a wireless LAN (Wi-Fi or Bluetooth) signal), and/or a second wireless communication signal (e.g., a cellular signal), measured (or received) in the small area, the detailed location, and/or the short path.

In an embodiment, the magnetic sensing value, the first wireless communication signal, and/or the second wireless communication signal, included in the virtual marker 310, 320, and/or 330, may change according to a structure of the indoor space 300. For example, the magnetic sensing value, the first wireless communication signal, and/or the second wireless communication signal may change according to a building frame and/or a structure material (e.g., steel) of the indoor space 300. In another example, the magnetic sensing value, the first wireless communication signal, and/or the second wireless communication signal may change according to a shape and/or a material (e.g., steel) of an object disposed in the indoor space 300.

In an embodiment, when the virtual marker 310, 320, and/or 330 is data corresponding to the short path within the designated first-length range, the short path may be a path having the length of about 30 cm to 70 cm. The virtual marker 310, 320, and/or 330 may be data corresponding to a particular space in the indoor space 300 and/or an object disposed in the indoor space 300. The virtual marker 310, 320, and/or 330 may include a first virtual marker 310, a second virtual marker 320, and/or a third virtual marker 330, which are data corresponding to a particular space in the indoor space and/or an object disposed the indoor space. For example, the processor 120 may define the first virtual marker 310 as data indicating a space in front of a mirror in response to a user input. In another example, the processor 120 may define the second virtual marker 320 as data indicating a space in front of a door. In another example, the processor 120 may define the third virtual marker 330 as data indicating a space on stairs.

According to another embodiment, a virtual marker 410, 420, and/or 430 may be data corresponding to a long path within a designated second-length range in an indoor space 400. The virtual marker 410, 420, and/or 430 may be stored in the memory 130 of the electronic device 101. The virtual marker 410, 420, and/or 430 may include a magnetic sensing value, an acceleration sensing value, a gyro sensing value, a first wireless communication signal (e.g., a wireless LAN (Wi-Fi or Bluetooth) signal), and/or a second wireless communication signal (e.g., a cellular signal), measured (or received) on the long path.

In an embodiment, the magnetic sensing value, the acceleration sensing value, the gyro sensing value, the first wireless communication signal, and/or the second wireless communication signal, included in the virtual marker 410, 420, and/or 430, may change according to a structure of the indoor space 400. For example, the magnetic sensing value, the first wireless communication signal, and/or the second wireless communication signal may change according to the shape of the path and/or a structure around the path in the indoor space 400. In another example, the acceleration sensing value and/or the gyro sensing value may change according to a rate at which the electronic device 101 progresses (or moves) along the path, and/or the direction in which the electronic device 101 is oriented while progressing along the path.

In an embodiment, when the virtual marker 410, 420, and/or 430 is data corresponding to a long path within a designated second-length range, the long path may be a path having the length of about 5 m to 20 m. The virtual marker 410, 420, and/or 430 may be data corresponding to a particular movement path in the indoor space 400. For example, the virtual marker 410, 420, and/or 430 may be data corresponding to a movement path starting from a first point 410 to a third point 430 through a second point 420. The processor 120 may define, in response to a user input, the virtual marker 410, 420, and/or 430 as data indicating a consecutive progressing path such as the movement path starting from the first point 410 to the third point 430 through the second point 420.

In an embodiment, when generating the virtual marker, the processor 120 may determine the radius of a particular area in which the virtual marker is to be generated. The processor 120 may collect sensing values (or signals) measured (or received) upon the movement of the electronic device 101 within the determined radius by using a sensor module (e.g., the sensor module 176 of FIG. 1). The processor 120 may process an image acquired using a camera (e.g., the camera 180 of FIG. 1) supporting an augmented reality (AR) technology to perform spatial matching between sensing values (or signals) measured (or received) within an area having the determined radius and the area, so as to estimate an area where the electronic device 101 is located. The processor 120 may identify a feature from the image acquired using the camera 180. For example, when generating the virtual marker, the processor 120 may recognize a feature point (e.g., a featural space (a space in front of a mirror, a space in front of a door, or stairs), a floor pattern, the locations and the shapes of arranged furniture pieces, or a curve of a wall) in the image through the camera 180 while simultaneously measuring the sensing values (or receiving signals). The processor 120 may perform processing of designating a predetermined reference point on the image acquired using the camera 180. The processor 120 may estimate the distance by which the electronic device 101 has moved with reference to the reference point, based on the recognized feature point. The processor 120 may estimate a movement path (e.g., a movement path starting from the first point 410 to the third point 430 through the second point 420) on which the electronic device 101 moves from one point to another point in the indoor space 400. The processor 120 may measure the degree of the movement every period. The processor 120 may arrange, on the space, sensing values (or signal values) related to the measured degree of the movement.

FIG. 5 illustrates a one-dimensional virtual marker defined for an indoor space by an electronic device according to an embodiment of the disclosure.

Referring to FIG. 5, a one-dimensional virtual marker 510 may include a sensing value and/or a signal value including information on a one-dimensional line shape of the location and/or a particular area in an indoor space. The one-dimensional virtual marker 510 may be stored in a memory (e.g., the memory 130 of FIG. 1) of an electronic device (e.g., the electronic device 101 of FIG. 1). The one-dimensional virtual marker 510 may include a magnetic sensing value 520, an acceleration sensing value 530, a gyro sensing value 540, a first wireless communication signal 550 (e.g., a wireless LAN (Wi-Fi or Bluetooth) signal value), and/or a second wireless communication signal 560 (e.g., a cellular signal).

In an embodiment, the magnetic sensing value 520 may include a value of a direction-specific strength of a magnetic field measured at a particular rate in a particular area and/or location according to a designated sampling rate. A processor (e.g., the processor 120 of FIG. 1) may configure a time period for which a value of the direction-specific strength of the magnetic field is measured one time according to a designated length. For example, when the sampling rate is 1 Hz and the length is 0.1 seconds, the processor 120 may measure a value of the direction-specific strength of the magnetic field every second. The measurement of the value of the strength of the magnetic field may be maintained for 0.1 seconds during one count. The processor 120 may measure the magnetic field in the particular area and/or location by using a magnetic sensor included a sensor module (e.g., the sensor module 176 of FIG. 1). For example, the processor 120 may measure the magnetic field from a first time point (Timestamp 1) to an $N^{th}$ (N is a natural number) time point (Timestamp N) by using the sensor module 176. In this case, the magnetic sensing value 520 measured at the first time point (Timestamp 1) may include a strength (MagX1) of the magnetic field in the X-axis direction, a strength (MagY1) of the magnetic field in the Y-axis direction, and a strength (MagZ1) of the magnetic field in the Z-axis direction, the strengths being measured at the first time point (Timestamp 1). Similarly, the magnetic sensing value 520 measured at the $N^{th}$ time point (Timestamp N) may include a strength (MagXN) of the magnetic field in the X-axis, a strength (MagYN) of the magnetic field in the Y-axis, and a strength (MagZN) of the magnetic field in the Z-axis, the strengths being measured at the $N^{th}$ time point (Timestamp N).

In an embodiment, the acceleration sensing value 530 may include a value of a direction-specific strength of acceleration of the electronic device 101, measured at a particular rate in the in a particular area and/or location according to a designated sampling rate. The processor 120 may configure a time period for which a value of the direction-specific strength of the acceleration is measured one time according to a designated length. The processor 120 may measure the acceleration of the electronic device 101 in the particular area and/or location from a first time point (Timestamp 1) to an $N^{th}$ time point (Timestamp N) by using an accelerometer included in the sensor module 176. For example, the acceleration sensing value 530 measured at the first time point (Timestamp 1) may include acceleration (AccX1) in the X-axis direction of the electronic device 101, acceleration (AccY1) in the Y-axis direction of the electronic device 101, and acceleration (AccZ1) in the Z-axis direction of the electronic device 101, the acceleration being measured at the first time point (Timestamp 1). Similarly, the acceleration sensing value 530 measured at the $N^{th}$ time point (Timestamp N) may include acceleration (AccXN) in the X-axis direction of the electronic device 101, acceleration (AccYN) in the Y-axis direction of the electronic device 101, and acceleration (AccZN) in the Z-axis direction of the electronic device 101, the acceleration being measured at the $N^{th}$ time point (Timestamp N).

In an embodiment, the gyro sensing value 540 may include a value of the orientation of an angle between the electronic device 101 and the ground, the value being measured in a particular area and/or location according to a designated sampling rate. The processor 120 may configure a time period for which a value of the orientation of the angle is measured one time according to a designated length. The processor 120 may measure the value of the orientation of the angle between the electronic device 101 and the ground in the particular area and/or location from a first time point (Timestamp 1) to an $N^{th}$ time point (Timestamp N) by using a gyroscope included in the sensor module 176. For example, the gyro sensing value 540 measured at the first time point (Timestamp 1) may include a roll value (Roll1) of the electronic device 101, a pitch value (Pitch1) of the electronic device 101, and a yaw value (Yaw1) of the electronic device 101, the values being measured at the first time point (Timestamp 1). Similarly, the gyro sensing value 540 measured at the $N^{th}$ time point (Timestamp N) may include a roll value (RollN) of the electronic device 101, a pitch value (PitchN) of the electronic device 101, and a yaw value (YawN) of the electronic device 101, the values being measured at the $N^{th}$ time point (Timestamp N).

In an embodiment, the first wireless communication signal 550 may be a value of the strength of an access point (AP) signal, measured by a wireless communication module (e.g., the wireless communication module 192 of FIG. 1). The first wireless communication signal 550 may include information related to the number of AP signals of a wideband LAN (WLAN). The first wireless communication signal 550 may include information related to the strength of the AP signal, measured in the particular area and/or location. For example, the first wireless communication signal 550 may include a first AP signal strength (AP1 signal strength) to an $N^{th}$ AP signal strength (APN signal strength).

In an embodiment, the second wireless communication signal 560 may be a value of the strength of a cell signal in cellular communication, the strength being measured by the wireless communication module 192. The second wireless communication signal 560 may include information related to the number of cells. The second wireless communication signal 560 may include information related to the strengths of the first to $N^{th}$ cell signals, measured in the particular area and/or location. For example, the second wireless communication signal 560 may include a first cell signal strength (Cell1 signal strength) to an $N^{th}$ cell signal strength (cellN signal strength).

In an embodiment, the processor 120 of the electronic device 101 may determine the radius of a particular area in which the one-dimensional virtual marker 510 is to be generated. The processor 120 may collect sensing values (or signal values) relating to the movement of the electronic device 101 by using the sensing module 176 within the determined radius of the area.

In an embodiment, the processor 120 of the electronic device 101 may process an image acquired using a camera (e.g., the camera 180 of FIG. 1) supporting an augmented reality (AR) technology to perform spatial matching between sensing values (or signals) measured (or received) within an area having the determined radius and the area, so as to estimate an area where the electronic device 101 is located.

In an embodiment, the processor 120 may generate the one-dimensional virtual marker 510 by using the collected sensing values and/or signal values, and the form of the virtual marker is not limited thereto, and may be a two-dimensional plane or a three-dimensional space. In an embodiment, the one-dimensional virtual marker 510 may include movement information of the electronic device 101, such as sensing values (or signal values) changed while the electronic device 101 moves, a movement rate of the electronic device 101, and/or the direction of the electronic device 101. The one-dimensional virtual marker 510 may include a feature of a designated area. When the processor 120 generates the one-dimensional virtual marker 510 in an indoor space (e.g., the indoor space 300 of FIG. 3 or the indoor space 400 of FIG. 4), a feature related to the shape of the indoor space structure and/or a physical feature of an object disposed in the indoor space may be applied to the one-dimensional virtual marker 510. For example, the one-dimensional virtual marker 510 may reflect the shape of a structure, such as a steel frame, stairs and/or walls, related to the indoor space. In another example, the one-dimensional virtual marker 510 may reflect a material feature of an object such as furniture disposed in the indoor space.

In an embodiment, the one-dimensional virtual marker 510 may include magnetic field information in which structure information of the indoor space is reflected. The one-dimensional virtual marker 510 may include an acceleration value and/or rotational motion information of the electronic device 101. The one-dimensional virtual marker 510 may include peripheral wireless signal information related to power consumption optimization of the electronic device 101. For example, the one-dimensional virtual marker 510 may include Wi-Fi signal information and/or cellular signal information. In the one-dimensional virtual marker 510, the first time point (Timestamp 1) to the $N^{th}$ time point (Timestamp N) may be determined to be a time range value configured to measure sensing values such as magnetic field information every period.

FIG. 6 illustrates a two-dimensional virtual marker defined for an indoor space by an electronic device according to an embodiment of the disclosure.

Figure 7:
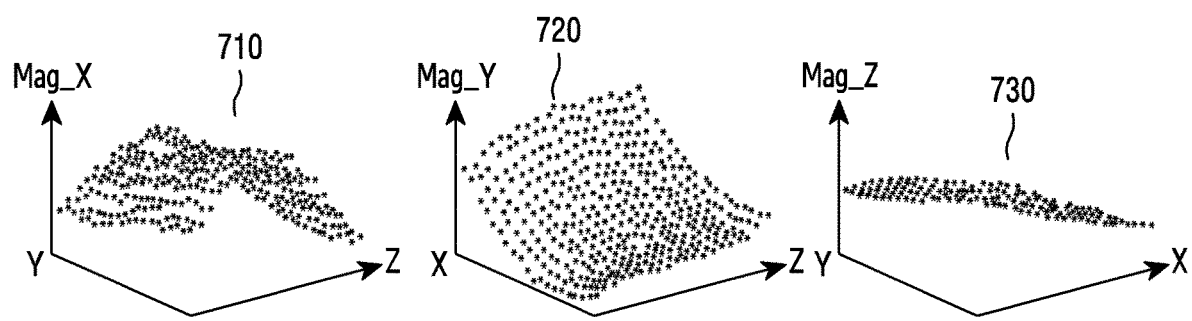
FIG. 7 illustrates an image of multiple pieces of data included in a two-dimensional virtual marker according to an embodiment of the disclosure.

FIG. 7 illustrates an image of multiple pieces of data included in a two-dimensional virtual marker according to an embodiment of the disclosure.

Referring to FIG. 6, a processor (e.g., the processor 120 of FIG. 1) of an electronic device (e.g., the electronic device

101 of FIG. 1) may sense a magnetic sensing value 620, an acceleration sensing value 630, a gyro sensing value 640, a first wireless communication signal 650, and/or a second wireless sensing signal 660 on a two-dimensional plane. The magnetic sensing value 620, the acceleration sensing value 630, the gyro sensing value 640, the first wireless communication signal 650, and/or the second wireless communication signal 660 may be measured in substantially the same manner as that of measuring the magnetic sensing value 520, the acceleration sensing value 530, the gyro sensing value 540, the first wireless communication signal 550, and/or the second wireless communication signal 560 in FIG. 5. The magnetic sensing value 620, the acceleration sensing value 630, the gyro sensing value 640, the first wireless communication signal 650, and/or the second wireless communication signal 660 may be included in a two-dimensional virtual marker cell 610. The two-dimensional virtual marker cell 610 may be a unit area obtained by dividing an area 615 in which the two-dimensional virtual marker is defined into designated sizes. The second-dimensional virtual marker may be generated through combination of the two-dimensional virtual marker cells 610 for each area.

In an embodiment, a virtual marker may not be limited to a one-dimensional virtual marker, and may be extended to a two-dimensional virtual marker and/or three-dimensional virtual marker. The two-dimensional virtual marker may be generated through mapping of a sensing value and/or a signal value measured in each two-dimensional virtual marker cell 610 corresponding to a unit on the plane in the two-dimensional space, onto an area for generation of the two-dimensional virtual marker. For example, the processor 120 may perform mapping onto the area so as to correspond to a structure of the area in which the sensing value and/or the signal value 620, 630, 640, 650, and/or 660 is measured. In another example, the processor 120 may perform mapping onto the area to correspond to an average value of the respective two-dimensional virtual marker cells 610 according to the size and/or the length of a cell or a movement path on which the sensing value and/or the signal value 620, 630, 640, 650, or 660 is measured. The processor 120 of the electronic device 101 may generate a two-dimensional virtual marker by mapping a sensing value and/or a signal value 620, 630, 640, 650, and/or 660 onto a second-dimensional plane. The processor 120 may display the second virtual marker obtained by mapping the measured sensing value and/or the signal value 620, 630, 640, 650, and/or 660 onto the second-dimensional plane, in numeral values in the respective cells on the plane.

Referring to FIG. 7, magnetic fields values (Mag_X, Mag_Y, and Mag_Z) measured with respect to respective X-axis, Y-axis, and Z-axis directions of an electronic device (e.g., the electronic device 101 of FIG. 1) may have different values according to the location in a two-dimensional space. A processor (e.g., the processor 120 of FIG. 1) of the electronic device 101 may increase not only the accuracy but also the precision of detection through comparison of all values in the X-axis, the Y-axis, and the Z-axis, thereby reducing possibility for occurrence of a false alarm of two-dimensional virtual markers 710, 720, and 730.

In an embodiment, the processor 120 of the electronic device 101 may measure a magnetic field strength (Mag_X) in the X-axis direction, a magnetic field strength (Mag_Y) in the Y-axis direction, and a magnetic field strength (Mag_Z) in the Z-axis direction on a two-dimensional plane (X-Y axis plane) by using a magnetic sensor of a sensor module (e.g., the sensor module 176 of FIG. 1). The processor 120 may display the generated two-dimensional virtual markers 710, 720, and 730 with magnetic field values measured through the sensor module 176, by using a display device (e.g., the display device 160 of FIG. 1). The two-dimensional virtual markers 710, 720, and 730 may be used for the respective X-axis, Y-axis, and Z-axis components of the electronic device 101, as an example. For example, the processor 120 may store the two-dimensional virtual markers 710, 720, and 730 in a memory (e.g., the memory 130 of FIG. 1). In another example, the processor 120 may show, as images, magnetic fields for the respective X-axis, Y-axis, and Z-axis components to identify the two-dimensional virtual markers 710, 720, and 730.

FIG. 8 illustrates the form of registration and loading of a virtual marker of an electronic device according to an embodiment of the disclosure.

Figure 9:
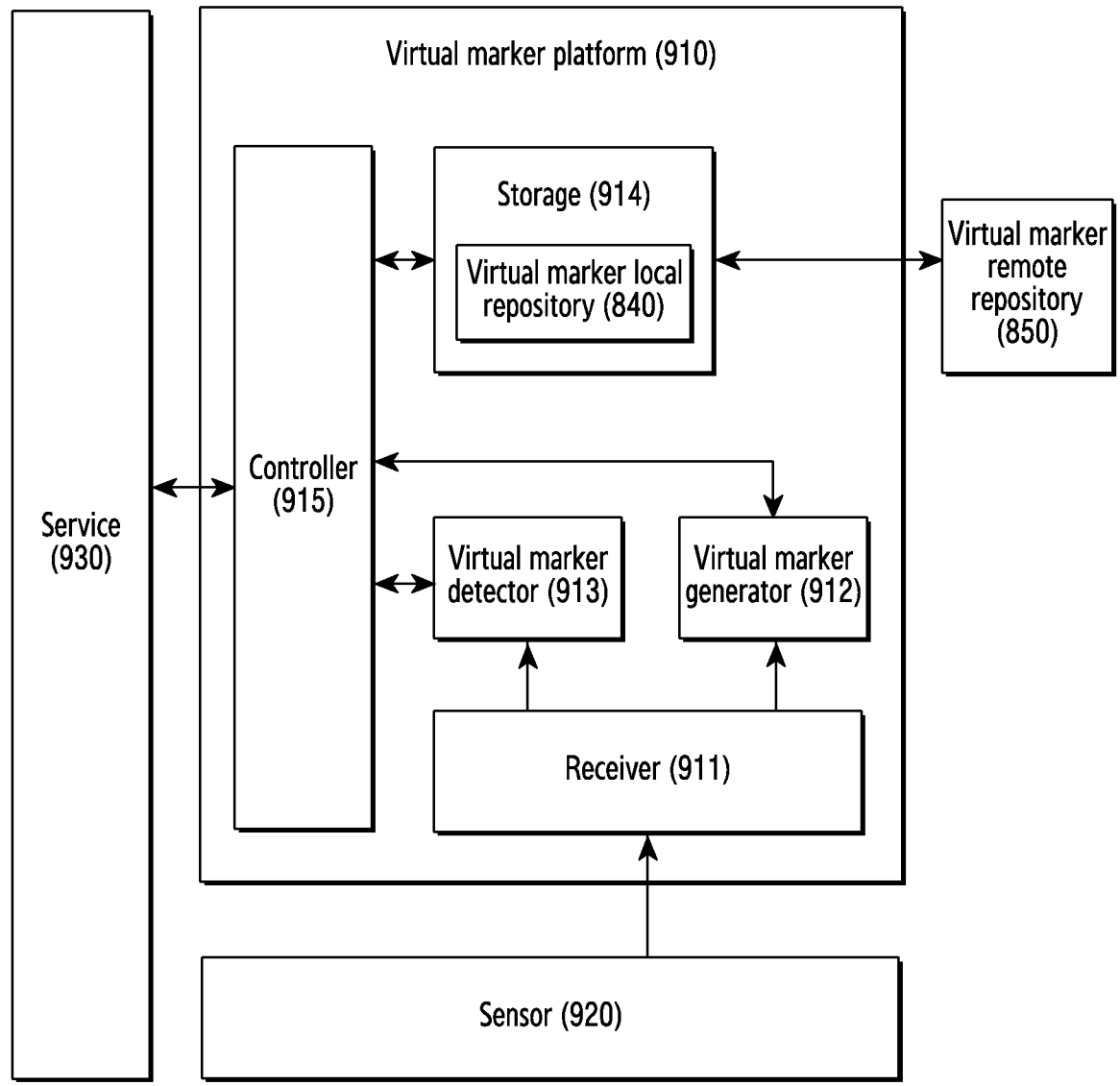
FIG. 9 illustrates a virtual marker platform of an electronic device according to an embodiment of the disclosure.

FIG. 9 illustrates a virtual marker platform of an electronic device according to an embodiment of the disclosure.

Referring to FIG. 2, in an embodiment, a processor (e.g., the processor 120 of FIG. 1) of an electronic device (e.g., the electronic device 101 of FIG. 1) may perform an operation of virtual marker registration 220. For example, the processor 120 may store the virtual marker in a memory (e.g., the memory 130 of FIG. 1). The virtual marker stored in the memory 130 may be registered in the virtual marker list in the memory 130.

In an embodiment, the processor 120 of the electronic device 101 may perform an operation of virtual marker loading 230. After generating the virtual marker, the processor 120 may store the virtual marker in the memory 130, and register the virtual marker in the virtual marker list. The processor 120 may load the virtual marker to detect the virtual marker registered in the virtual marker list. For example, executing an application (e.g., the application 146 of FIG. 1) for processing an event corresponding to the virtual marker registered in the electronic device 101, the processor 120 may load the virtual marker. In another example, the processor 120 may load the virtual marker when identifying that the electronic device 101 has entered within a predetermined radius with reference to an area in the indoor space corresponding to the registered virtual marker. In another example, the processor 120 may load a virtual marker to detect among the virtual marker registered in the virtual marker list, from the memory 130 when receiving a notification of a service associated with the area corresponding to the virtual marker.

In relation to the registration and the loading of the virtual marker, referring to FIGS. 8 and 9, the processor 120 of the electronic device 101 may generate a virtual marker 810 and register, store, and/or load the same. In relation to this, the processor 120 may include at least one of a virtual marker generator 820 and a virtual marker controller 830. The memory 130 may include a virtual marker local repository 840. For example, the virtual marker local repository 840 may be a storage space included in the memory 130 of the electronic device 101. The electronic device 101 may be connected to a virtual marker remote repository 850. The virtual marker remote repository 850 may be a server (e.g., the server 108 of FIG. 1) connected to a wireless communication module (e.g., the wireless communication module 192 of FIG. 1) of the electronic device 101 via a network.

In an embodiment, the processor 120 may register and/or store the generated virtual marker 810 in the virtual marker list. The virtual marker list may exist in the virtual marker local repository 840 and/or the virtual marker remote repository 850.

In an embodiment, the processor 120 may load the virtual marker 810 registered and/or stored in the virtual marker list.

The processor 120 may load the virtual marker 810 from the virtual marker local repository 840 and/or the virtual marker remote repository 850.

In an embodiment, the virtual marker local repository 840 may transmit (or share) the virtual marker 810 to (or with) the virtual marker remote repository 850. The virtual marker remote repository 850 may store the virtual marker 810 received from the virtual marker local repository 840. The virtual marker 810 stored in the virtual marker remote repository 850 may be shared with an external electronic device. The virtual marker remote repository 850 may share the registered and/or stored virtual marker 810 to the external electronic device.

In an embodiment, the processor 120 may download the virtual marker registered and stored in the virtual marker remote repository 850 by the external electronic device. The virtual marker registered by the external electronic device may be shared with the processor 120.

According to an embodiment, a virtual marker platform 910 may be stored in the memory 130 of the electronic device 101. The virtual marker platform 910 may include one or more instructions. The processor 120 may load the virtual marker platform 910 from the memory 130 and execute the same. According to an embodiment, the virtual marker platform 910 may include a receiver 911, a virtual marker generator 912, a virtual marker detector 913, a storage 914, and a controller 915.

In an embodiment, the receiver 911 may receive sensing data from a sensor 920. The sensing data may include a magnetic sensing value, an acceleration sensing value, and/or a gyro sensing value.

In an embodiment, the receiver 911 may collect the sensing data and provide the collected sensing data to the virtual marker generator 912 and/or the virtual marker detector 913. The receiver 911 may collect data from the sensor 920 including a magnetic sensor, an acceleration sensor, and/or a gyro sensor.

In an embodiment, the receiver 911 may correct the sensing data by using movement information of the electronic device 101 to use the same for generation and/or detection of a virtual marker (e.g., the virtual marker 810 of FIG. 8). The receiver 911 may generate information such as the direction and/or the posture of the electronic device 101 from the sensing data collected for provision of information necessary and/or efficient for the generation and/or the detection of the virtual marker 810, and provide the generated information to the virtual marker generator 912 and/or the virtual marker detector 913.

In an embodiment, the virtual marker generator 912 may generate the virtual marker 810 corresponding to an area where the electronic device is currently located, by using the sensing data. In relation to this, the virtual marker generator 912 may receive a request for generating the virtual marker 810 from the controller 915. The virtual marker generator 912 may generate the virtual marker 810 according to a designated format, based on the sensing data such as magnetic field information received from the receiver 911, movement information of the electronic device 101, and/or an image of a camera (e.g., the camera 180 of FIG. 1) supporting augmented reality. The virtual marker generator 912 may request to register the generated virtual marker 810 from the controller 915.

In an embodiment, the virtual marker detector 913 may detect a predetermined virtual marker. For example, the virtual marker detector 913 may detect a virtual marker corresponding to the virtual marker 810. When detecting the virtual marker corresponding to the virtual marker 810, the virtual marker detector 913 may transfer information related to the detected virtual marker to the controller 915.

In an embodiment, the storage 914 may store the virtual marker 810. The storage 914 may include the virtual marker local repository 840. The virtual marker local repository 840 may be a physical or local area of a part of the memory 130. For example, the virtual marker local repository 840 may be a physically allocated partial area of the memory or may be defined as a logical memory address value. The virtual marker remote repository 850 may be a server (e.g., the server 108 of FIG. 1) external to the electronic device 101.

In an embodiment, the controller 915 may request the registration of the virtual marker 810 from the virtual marker local repository 840 and/or the virtual marker remote repository 850 to register the virtual marker 810. The controller 915 may transmit a request for loading the stored virtual marker list and/or the stored virtual marker 810 to the virtual marker local repository 840 and the virtual marker remote repository 850 to load the stored virtual marker list and/or the stored virtual marker 810 from the virtual marker local repository 840 and the virtual marker remote repository 850.

In an embodiment, the virtual marker 810 may be registered in the virtual marker local repository 840 and/or the virtual marker remote repository 850 according to whether the virtual marker 810 is to be used in the electronic device 101 only, or is to be also used in an external electronic device. In order to allow the virtual marker 810 to be also used in the external electronic device, the virtual marker 810 is required to be registered in the virtual marker remote repository 850.

In an embodiment, the controller 915 may register the virtual marker 810, detect a predetermined virtual marker, and load the virtual marker 810 from the storage 914. The controller 915 may control information and/or signals transmitted or received within the virtual marker platform 910.

In an embodiment, a service 930 may be a function related to detection of the virtual marker 810 in the electronic device 101. The service 930 may be an application (e.g., the application 146 of FIG. 1) executed in the location where the virtual marker 810 is detected, or a function (or an operation) provided by the application 146. For example, the service 930 may be a health app configured to be executed at the entrance of a gym where the electronic device 101 has detected the virtual marker 810. The service 930 may be a notification of notifying of an event occurring at the location where the virtual marker 810 is detected. For example, the service 930 may notify, through a push notification, that the electronic device 101 has entered the entrance of a grocery store. The service 930 may be a function of changing an operation of the application 146 or performing authentication upon the detection of the virtual marker 810. For example, when the electronic device 101 has entered a checkout counter, the service 930 may change the state of a payment app as a payment ready state, and display a guide for helping a user to perform the authentication.

In an embodiment, the controller 915 may provide the service 930 mapped to the location (or area) where the virtual marker 810 is detected. For example, when detecting that the electronic device 101 has entered the location (or area) where the virtual marker 810 is generated (or detects the virtual marker 810 in a predetermined area), the controller 915 may execute the service 930. In another example, when detecting that the electronic device 101 has entered the location (or area) where the virtual marker 810 is generated, the controller 915 may transmit a control signal requesting execution of a designated event to the service 930.

In an embodiment, the virtual marker platform 910 may not include at least one of the elements illustrated in FIG. 9, include other elements that are not illustrated, or include an element into which multiple elements are integrated. For example, the storage 914 may be an element that is separate from the virtual marker platform 910.

Figure 10:
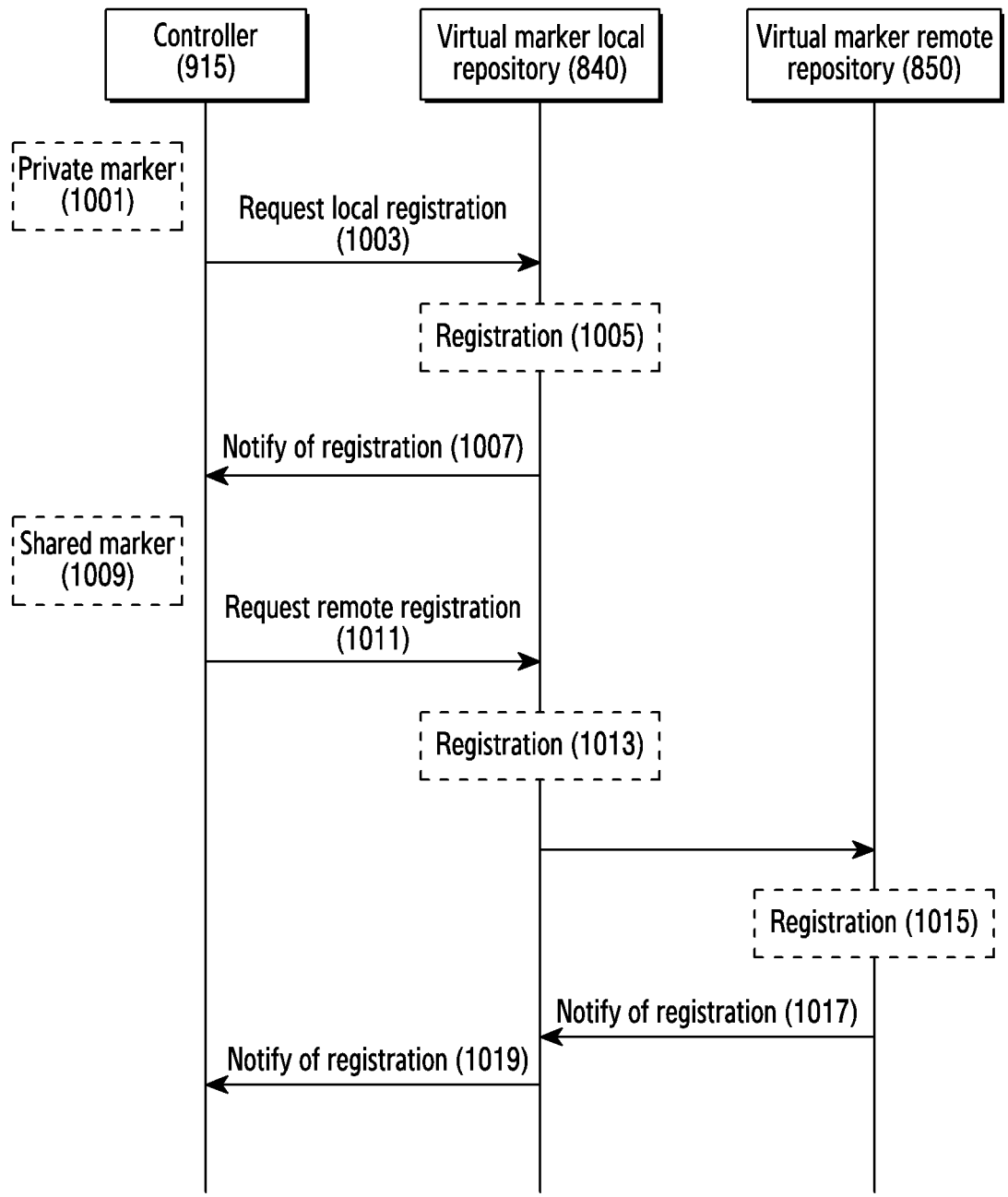
FIG. 10 illustrates a process of registering a virtual marker of an electronic device according to an embodiment of the disclosure.
Figure 11:
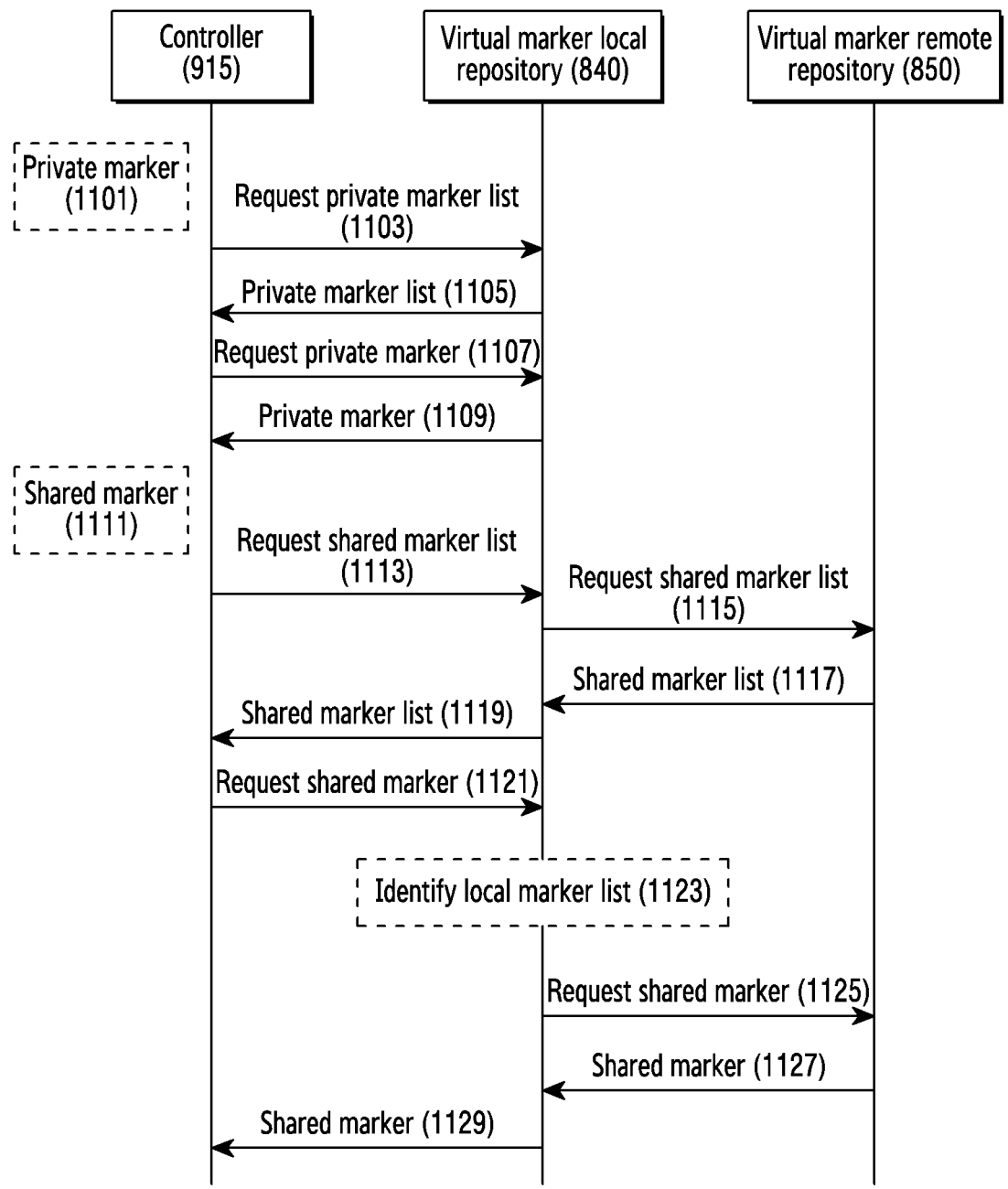
FIG. 11 illustrates a process of loading a virtual marker of an electronic device according to an embodiment of the disclosure.

FIG. 10 illustrates a process of registering a virtual marker of an electronic device according to an embodiment of the disclosure, FIG. 11 illustrates a process of loading a virtual marker of an electronic device according to an embodiment of the disclosure.

Referring to FIG. 10, in operation 1003, a controller (e.g., the controller 915 of FIG. 9) may request local registration of a private marker 1001 from a virtual marker local repository (e.g., the virtual marker local repository 840). In operation 1005, the virtual marker local repository 840 may register the private marker 1001 in response to the request. In operation 1007, the virtual marker local repository 840 may notify the controller 915 of the registration of the private marker 1001.

In operation 1011, the controller 915 may request remote registration of a shared marker 1009 from the virtual marker local repository 840. In operation 1013, the virtual marker local repository 840 may register the shared marker 1009. The virtual marker local repository 840 may transfer the shared marker 1009 to a virtual marker remote repository (e.g., the virtual marker remote repository 850 of FIG. 9). In operation 1015, the virtual marker remote repository 850 may register the shared marker 1009 transferred from the virtual marker local repository 840. In operation 1017, the virtual marker remote repository 850 may notify the virtual marker local repository 840 of the registration of the shared marker 1009. In operation 1019, the virtual marker local repository 840 may notify the controller 915 of the registration of the shared marker 1009.

In an embodiment, the private marker 1001 and the shared marker 1009 may be the same data. The private marker 1001 and the shared marker 1009 may be distinguished from each other according whether data is shared with another electronic device. For example, the shared marker 1009 may be data which can be shared with another electronic device or is determined to be shared. The shared marker 1009 may be registered in the virtual marker remote repository 850 to be shared with another electronic device.

Referring to FIG. 11, a virtual marker according to an embodiment may include a private marker 1101 and a shared marker 1111. The private marker 1101 and the shared marker 1111 of FIG. 11 may be substantially the same as the private marker 1001 and the shared marker 1009 of FIG. 10.

In operation 1103, a controller (e.g., the controller 915 of FIG. 9) may request a private marker list from a virtual marker local repository (e.g., the virtual marker local repository 840 of FIG. 9). In operation 1105, the virtual marker local repository 840 may transfer the private marker list to the controller 915 in response to the request. The controller 915 may identify whether the private marker 1101 exists in the private marker list of the virtual marker local repository 840. In operation 1107, the controller 915 may request a private marker from the virtual marker local repository 840. In operation 1109, the virtual marker local repository 840 may transfer the private marker to the controller 915. The controller 915 may identify whether the private marker 1101 matches to the private marker stored in the virtual marker local repository 840.

In operation 1113, the controller 915 may request a shared marker list from the virtual marker local repository 840. In operation 1115, the virtual marker local repository 840 may request the shared marker list from a virtual marker remote repository (e.g., the virtual marker remote repository 850 of FIG. 9). In operation 1117, the virtual marker remote repository 850 may transfer the shared marker list to the virtual marker local repository 840. In operation 1119, the virtual marker local repository 840 may transfer the shared marker list to the controller 915. The controller 915 may identify whether the shared marker 1111 exists in the shared marker list of the virtual marker remote repository 850.

In operation 1121, the controller 915 may request the shared marker from the virtual marker local repository 840. In operation 1123, the virtual marker local repository 840 may identify the local marker list. The virtual marker local repository 840 may identify that there is no shared marker in the local marker list, and may transfer, in operation 1125, the shared marker request to the virtual marker remote repository 850. In operation 1127, the virtual marker remote repository 850 may transfer the shared marker to the virtual marker local repository 840. In operation 1129, the virtual marker local repository 840 may transfer the shared marker to the controller 915. The controller 915 may identify whether the shared marker 1111 matches to the shared marker stored in the virtual marker remote repository 850.

Figure 12:
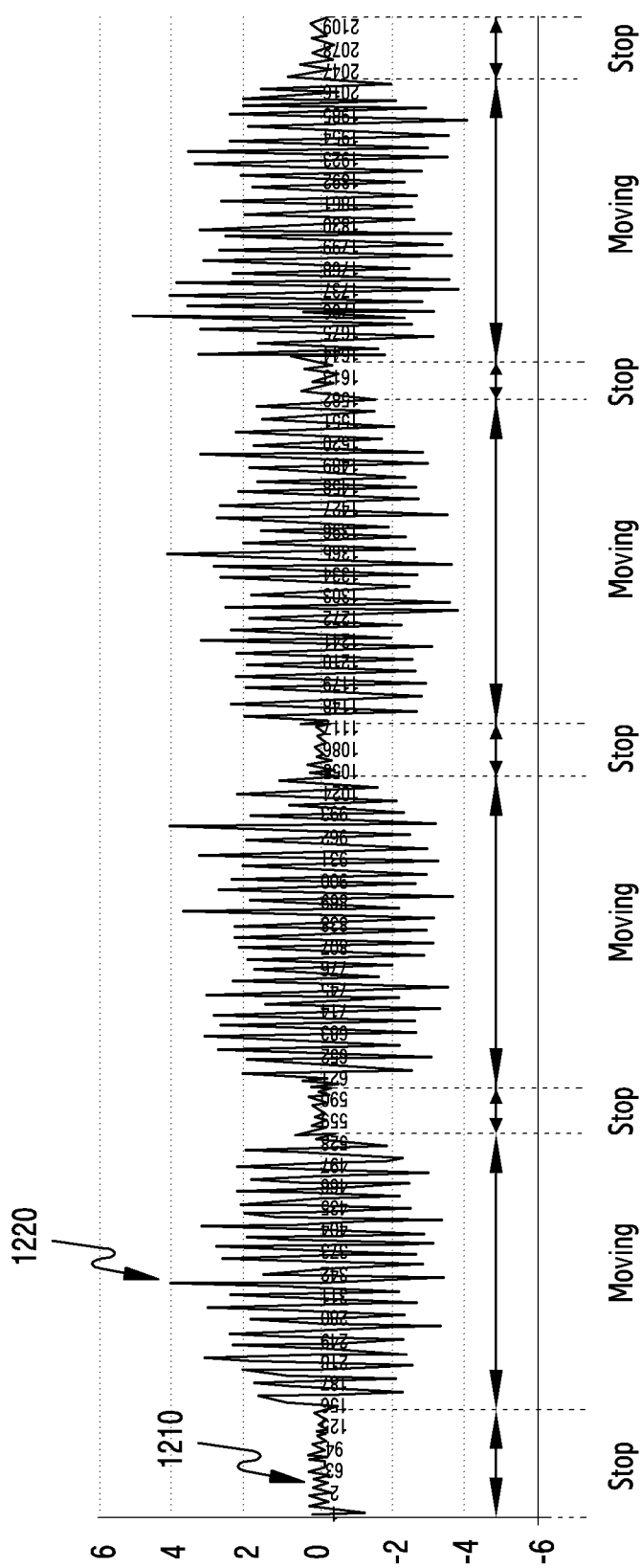
FIG. 12 illustrates a change in acceleration of an electronic device in a first direction according to an embodiment of the disclosure.

FIG. 12 illustrates a change in acceleration of an electronic device in a first direction according to an embodiment of the disclosure.

Figure 13:
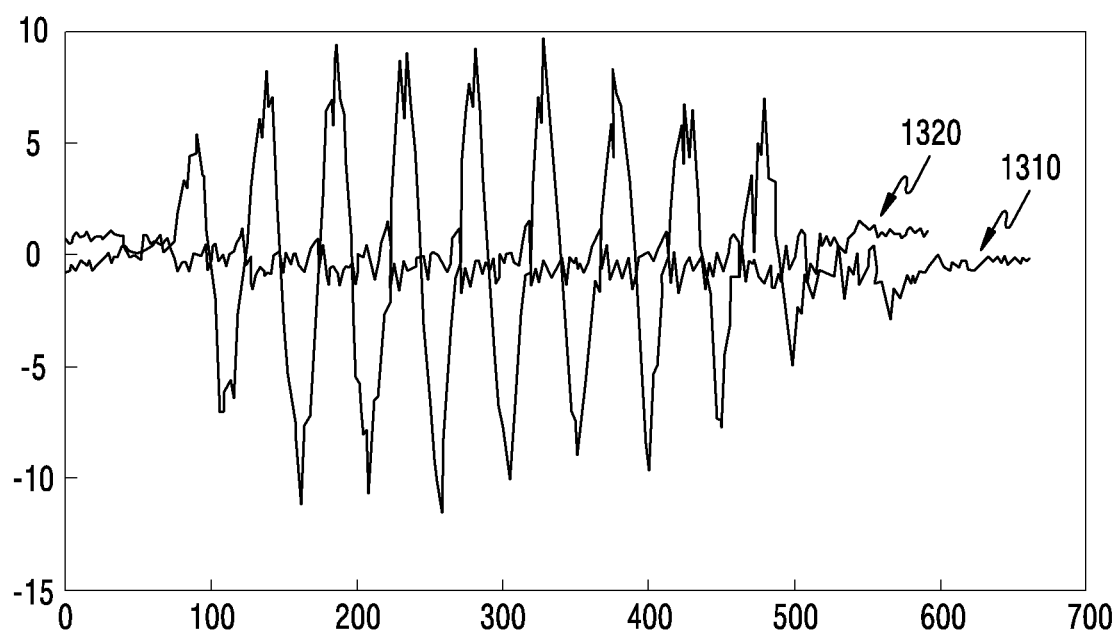
FIG. 13 illustrates a change in acceleration of an electronic device in a second direction according to an embodiment of the disclosure.

FIG. 13 illustrates a change in acceleration of an electronic device in a second direction according to an embodiment of the disclosure.

Referring to FIG. 2, a processor (e.g., the processor 120 of FIG. 1) of an electronic device (e.g., the electronic device 101 of FIG. 1) may perform an operation of the peripheral virtual marker detection 240. The processor 120 may register a virtual marker for a particular area or path in an indoor space, and then identify whether the electronic device 101 has entered the particular area or path. For example, the processor 120 may identify whether the electronic device 101 has entered within the radius having a predetermined size with reference to the particular area or path.

In an embodiment, to identify whether the electronic device 101 has entered within the radius having a predetermined size with reference to a particular area or path (or a virtual marker defined for a particular area or path), the processor 120 may use a cellular signal and/or a wireless LAN signal which can perform permanent reception and requires no separate power consumption for transmission or reception. For example, when a cellular signal or a wireless LAN signal received using a wireless communication circuit (e.g., the wireless communication module 192 of FIG. 1) has the same characteristic as or a characteristic similar to a wireless signal received within the radius having the designated size by a designated level or higher, the processor 120 may determine that the electronic device 101 has entered or is located within the radius having the designated size.

In an embodiment, when the entry or staying of the electronic device 101 for a designated time or longer within the defined radius with reference to the particular area or path or is determined, the processor 120 may control at least one sensor (e.g., a magnetic sensor, an acceleration sensor, and/or a gyro sensor) included in a sensor module (e.g., the sensor module 176 of FIG. 1) to be activated.

In an embodiment, the processor 120 may perform an operation of the sensing value processing 250. In relation to this, the processor 120 may acquire a sensing value (e.g., a magnetic sensing value, an acceleration sensing value, and/ or a gyro sensing value) by using the sensor module 176 within the radius related to the particular area or path.

Referring to FIG. 12, in relation to the sensing value processing 250, the processor 120 may identify a change in acceleration of the electronic device 101 in a first direction (e.g., the direction of gravity), based on an acceleration sensing value acquired within the radius related to the particular area or path. In relation to this, the acceleration sensing value acquired every time period using the sensor module 176 may indicate similarly repeating patterns in the first direction according to whether a user carrying the electronic device 101 moves. For example, when the user carrying the electronic device 101 stops (e.g., in a state where feet are in contact with the ground), the movement of the electronic device 101 is be comparatively less influenced by the user, and accordingly, the acceleration sensing value acquired while the user stops may indicate a first size 1210 that is substantially minor in the first direction. In another example, when the user carrying the electronic device 101 moves (e.g., in a state one foot is in contact with the ground), the movement of the user may attribute to the movement of the electronic device 101, and accordingly, the acceleration sensing value acquired while the user moves may indicate a second size 1220 which is distinguished from the first size 1210 (e.g., which is greater than the first size 1210) in the first direction. Based on the description above, one movement of the user (e.g., an operation in which a foot in a state of being in contact with the ground is taken off from the ground, and then comes into contact with the ground again) may be understood as one movement of the electronic device 101 in the first direction.

According to an embodiment, the processor 120 may determine an average distance of one movement of the user (e.g., the user's step), based on the patterns from the acceleration sensing values having the first size 1210 and the second size 1220 are acquired. For example, the processor 120 may determine an average distance of one movement of the user, based on a time range in which the acceleration sensing value having the second size 1220 is maintained with the size equal to or greater than a designated threshold size.

Referring to FIG. 13, in relation to the sensing value processing 250, the processor 120 may identify a change in acceleration of the electronic device 101 in a second direction (e.g., a direction perpendicular to the direction of gravity), based on an acceleration sensing value acquired within the radius related to the particular area or path. In relation to this, an acceleration sensing value acquired every designated period by using the sensor module 176 when a user carrying the electronic device 101 moves may indicate different patterns in the second direction according to how the user carries the electronic device 101. For example, when the electronic device 101 is carried by the user in a first posture (e.g., accommodated in clothing or belongings), the acceleration sensing value of the electronic device 101 in the second direction may indicate a first size change 1310 that is substantially minor (or less than a designated change amount). In another example, when the electronic device 101 is carried by the user in a second posture (e.g., held by the user's body (hand)), the acceleration sensing value of the electronic device 101 in the second direction may indicate a second size change 1320 which is distinguished from the first size change 1310 (which is greater than the first size change 1310, or is equal to or greater than a designated change amount), based on repeated movements of the user's body (e.g., arm swing). According to an embodiment, the processor 120 may determine the posture of the electronic device 101 by the user, based on the change in the acceleration value of the electronic device 101 in the second direction.

Figure 14:
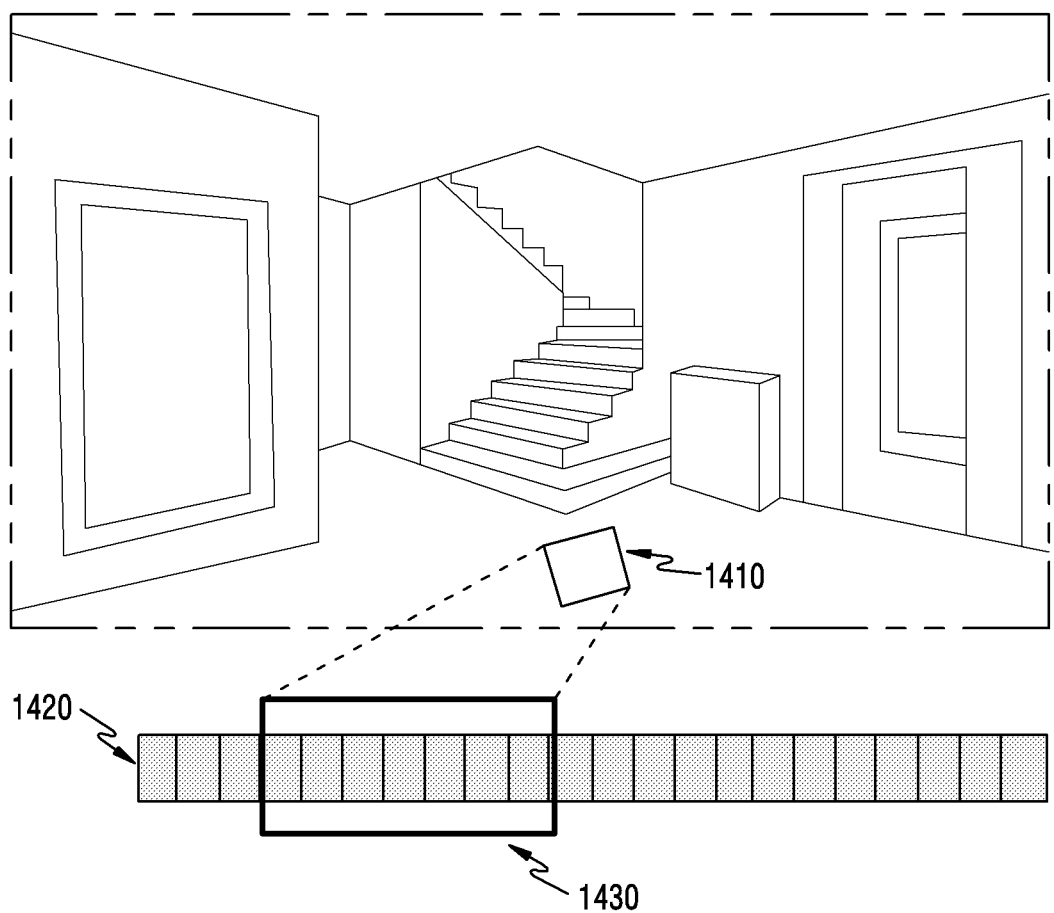
FIG. 14 illustrates an example of mapping multiple pieces of data with respect to a virtual marker by an electronic device according to an embodiment of the disclosure.

FIG. 14 illustrates an example of mapping multiple pieces of data with respect to a virtual marker by an electronic device according to an embodiment of the disclosure.

According to an embodiment, a processor (e.g., the processor 120 of FIG. 1) of an electronic device (e.g., the electronic device 101 of FIG. 1) may determine a part of data for comparison with a virtual marker defined in a particular area or path, among multiple pieces of data (e.g., a magnetic sensing value, an acceleration sensing value, and/or a gyro sensing value) acquired according to a designated time period within the radius related to the particular area or path, based on a change in the magnitude of acceleration of the electronic device 101 in a first direction (e.g., the direction of gravity) and a change in the magnitude of acceleration of the electronic device 101 in a second direction (e.g., the direction perpendicular to the direction of gravity). For example, when the acceleration sensing value of the electronic device 101 in the first direction indicates repeated patterns having the first size (e.g., 1210 of FIG. 12) and the second size (e.g., 1220 of FIG. 12) and the acceleration sensing value of the electronic device 101 in the second direction indicates a first size change (e.g., the first size change 1310 of FIG. 13) (or the posture of the electronic device 101 is determined as a first posture according to the first size change of the acceleration sensing value), the processor 120 may determine the number of consecutive pieces of partial data by using a first parameter relating to the size and the length of a particular area or path in which the virtual marker is defined and a second parameter relating to one movement of the electronic device 101 (e.g., a movement in a first direction (the direction of gravity) of the electronic device 101 by one movement of a user).

Referring to FIG. 14, the processor 120 may determine the movement of the electronic device 101 according to the acceleration sensing value of the electronic device 101 in the first direction, which indicates repeated patterns having the first size 1210 and the second size 1220, and may determine that the electronic device 101 is carried by the user in a first posture (e.g., accommodated in clothing or belongings) in which there is a minor influence by the movement of the user body. In this case, the processor 120 may calculate the number of movements of the electronic device 101 with respect to the particular area or path, by comparing the determined average distance of one movement of the user (or an average time range in which the acceleration sensing value having the second size (1220 of FIG. 12) is maintained with the size equal to or greater than a designated threshold size) with the size or the length of the particular area 1410 or path.

In an embodiment, the processor 120 may compare multiple pieces of data 1420 acquired within the radius related to the particular area 1410 or path with multiple pieces of data included in the virtual marker defined for the particular area 1410 or path, in real time or according to a designated period. In this operation, when the level of similarity between at least a part of the multiple pieces of data 1420 acquired within the radius and the multiple pieces of data included in the virtual marker is equal to or greater than a designated level, the processor 120 may determine that the electronic device 101 has entered the particular area 1410 or path. The processor 120 may determine the number of consecutive pieces of data 1430 acquired while the calculated number of movements of the electronic device 101 are detected in the particular area 1410 or path, with reference to a time point at which the entry of the electronic device 101 into the particular area 1410 or path is determined. The processor 120 may spatially and equally arrange the determined number of consecutive pieces of data 1430 with respect to the particular area 1410 or path, and may determine the similarity with at least a part of the multiple pieces of data included in the virtual marker predefined in the particular area 1410 or path, wherein the level of similarity is equal to or greater than a designated level. In an embodiment, when the level of similarity between at least a part of the determined number of consecutive pieces of data 1430 and at least a part of the multiple pieces of data included in the virtual marker is equal to or greater than a designated level, the processor 120 may determine that the electronic device 101 is located in the particular area 1410 or path.

Figure 15:
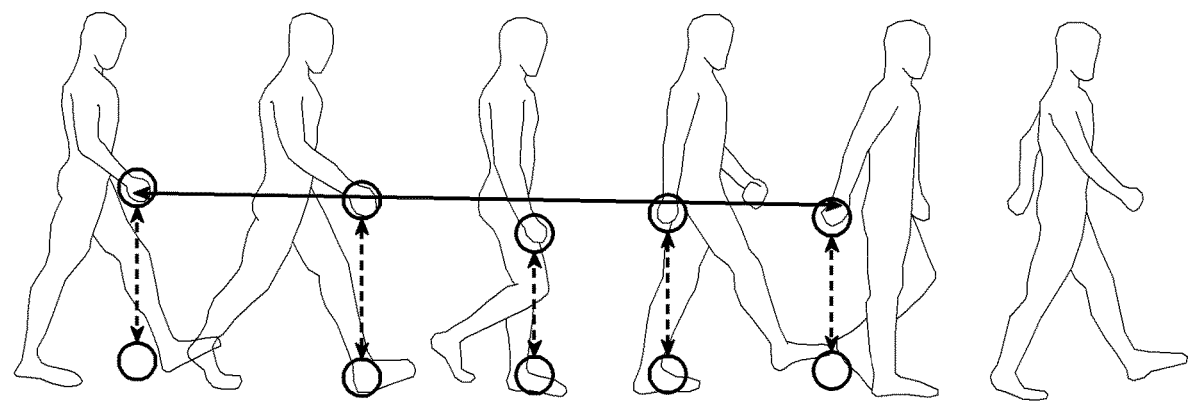
FIG. 15 illustrates a synchronous relationship between a user motion and the location of an electronic device according to an embodiment of the disclosure.

FIG. 15 illustrates a synchronous relationship between a user motion and the location of an electronic device according to an embodiment of the disclosure.

Figure 16A:
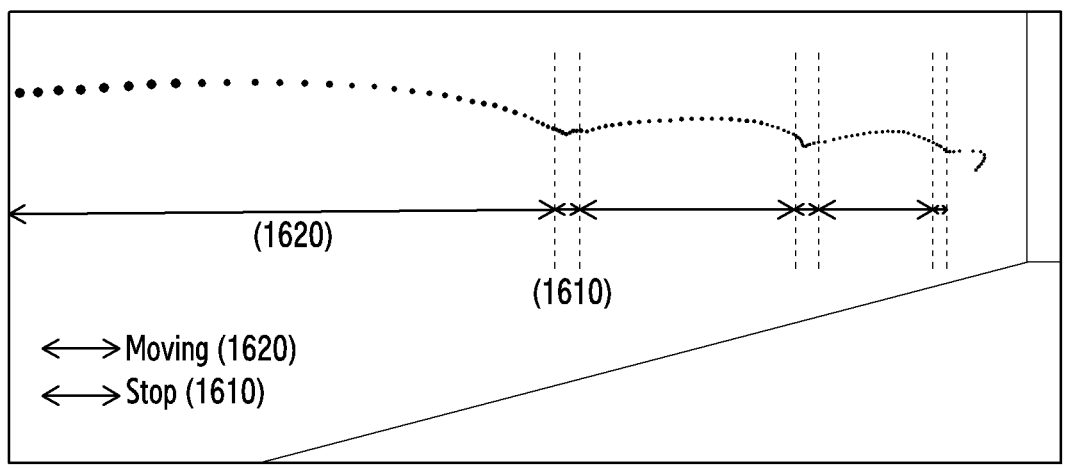
FIG. 16A illustrates a trajectory of moving or stopping of an electronic device according to an embodiment of the disclosure.

FIG. 16A illustrates a trajectory of moving or stopping of an electronic device according to an embodiment of the disclosure.

Figure 16B:
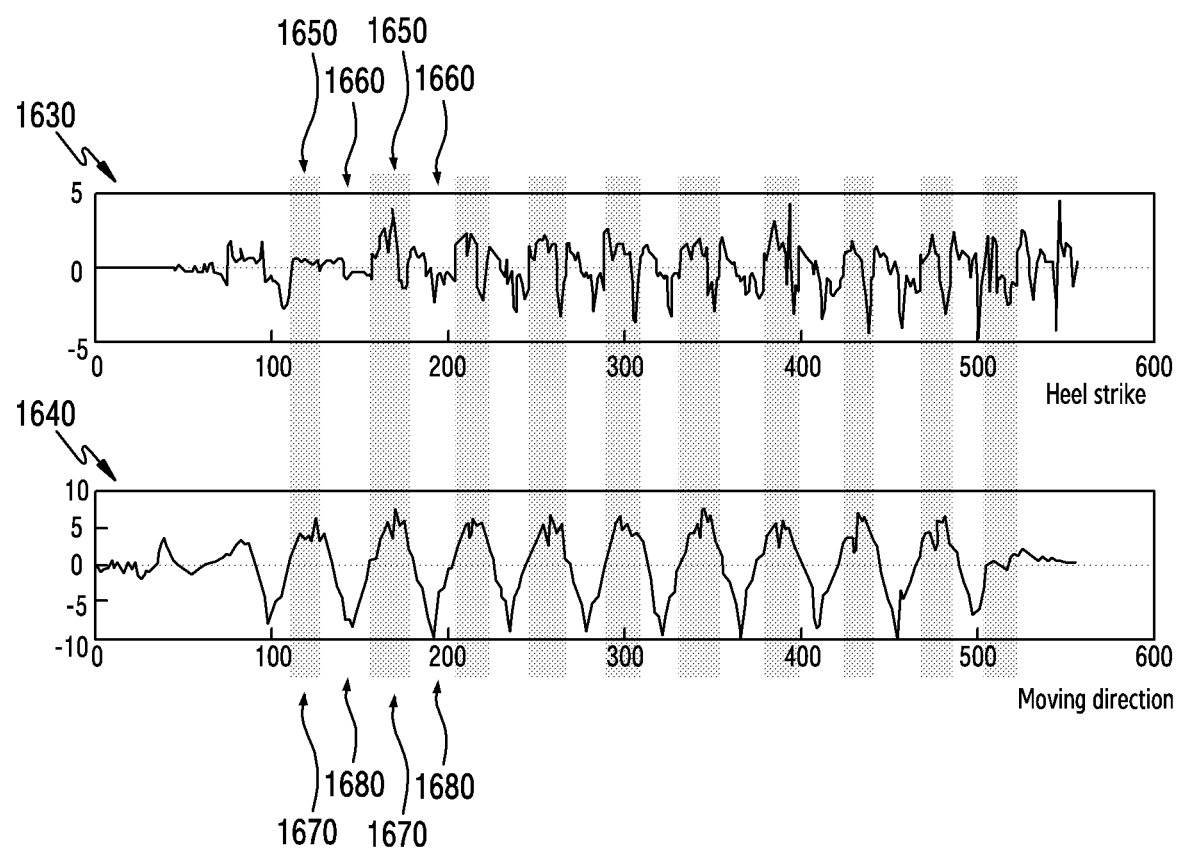
FIG. 16B illustrates a change in acceleration of an electronic device in a first direction and a second direction according to an embodiment of the disclosure.

FIG. 16B illustrates a change in acceleration of an electronic device in a first direction and a second direction according to an embodiment of the disclosure.

Referring to FIGS. 15 and 16A, when an electronic device (e.g., the electronic device 101 of FIG. 1) has a second posture by a user (e.g., when the electronic device is held by the user's body (hand)), there may be a synchronous relationship between a change in the location of the electronic device 101 and second movement of the user. In other words, when the electronic device 101 has a second posture by the right hand of the user, the location of the electronic device 101 may be synchronized with the left foot of the user. For example, while the user performs a first movement (e.g., an operation in which the right foot while being in contact with the ground is taken off from the ground, and then comes into contact with the ground again), the change in the location of the electronic device 101 may be substantially small, and multiple pieces of data may be acquired in the corresponding location (e.g., an interval in which the electronic device stops or an interval of stopping 1610), based on a time period related to data collection. In another example, while the first movement of the user is associated with a second movement (e.g., an operation in which the left foot in a state of being in contact with the ground is taken off, and then comes into contact with the ground again), the amount of a change in the location of the electronic device 101 may be large according to the movement (e.g., arm swing) of the right hand which is synchronized with the user's left foot, and a single piece of data may be acquired in at least a part of the multiple changing locations (e.g., an interval in which the location of the electronic device 101 moves, or an interval of proceeding 1620), based on the time period.

Referring to FIGS. 15 and 16B, when the electronic device 101 has a second posture by a user (e.g., when the electronic device is held by the user's body (right hand)), a change 1630 in acceleration of the electronic device 101 in a first direction (e.g., the direction of gravity) may have similarly repeating patterns. For example, an acceleration sensing value in an interval 1660 of a first movement (e.g., an operation in which a right foot in a state of being in contact with the ground is taken off from the ground, and then comes into contact with the ground again) of the user holding the electronic device 101 may indicate a first size that is greater than an acceleration sensing value measured while the user has stopped (e.g., while feet are in contact with the ground). In another example, an acceleration sensing value of the electronic device 101, measured in the first direction in an interval 1650 of a second movement (e.g., an operation in which a left foot in a state of being in contact with the ground is taken off, and then comes into contact with the ground again) of the user holding the electronic device 101, may indicate a second size that is greater than the first size. In relation to this, the location in the first direction of the electronic device 101 held by the user's right hand may be synchronized with the user's left foot. Based on the description, the acceleration sensing value of the electronic device 101 in the first direction, measured in the interval 1650 of the second movement according to the movement of the user's left foot, may be relatively larger than the acceleration sensing value measured in the interval 1660 of the first movement.

In an embodiment, when the electronic device 101 has a second posture by the user (e.g., when the electronic device is held by the user's body (right hand)), a change 1640 in acceleration of the electronic device 101 in a second direction (e.g., the direction perpendicular to the direction of gravity, or the moving direction of the electronic device, which corresponds to the moving direction of the user) may have similarly repeating patterns. For example, an acceleration sensing value of the electronic device 101, measured in the second direction in an interval 1680 of a first movement (e.g., an operation in which a right foot in a state of being in contact with the ground is taken off from the ground, and then comes into contact with the ground again) of the user holding the electronic device 101, may indicate a first size that is substantially minor (or is less than a designated change amount). In another example, an acceleration sensing value of the electronic device 101, measured in the second direction in an interval 1670 of a second movement (e.g., an operation in which a left foot in a state of being in contact with the ground is taken off from the ground, and then comes into contact with the ground again) of the user holding the electronic device 101, may indicate a second size that is greater than the first size. In relation to this, the user's right hand may be synchronized with the left foot, and the acceleration sensing value, measured in the second direction of the electronic device 101 held by the right hand during the interval 1670 of the second movement of the user according to the movement of the left foot, may be relatively greater than the first size of the acceleration sensing value measured in the interval 1680 of the first movement of the user by the arm swing of the right hand.

Figure 17:
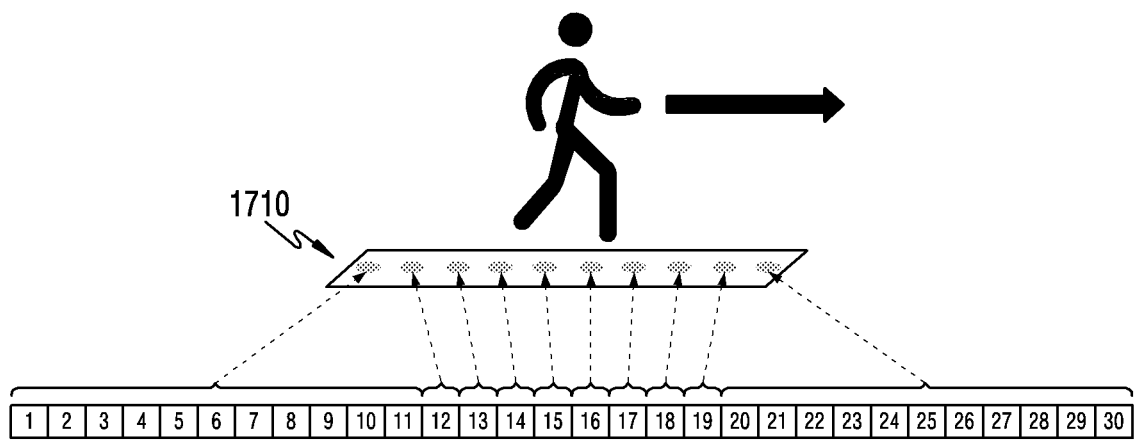
FIG. 17 illustrates another example of mapping multiple pieces of data with respect to a virtual marker by an electronic device according to an embodiment of the disclosure.

FIG. 17 illustrates another example of mapping multiple pieces of data with respect to a virtual marker by an electronic device according to an embodiment of the disclosure.

According to an embodiment, a processor (e.g., the processor 120 of FIG. 1) of an electronic device (e.g., the electronic device 101 of FIG. 1) may determine a part of data for comparison with a virtual marker defined in a particular area (or path), among multiple pieces of data (e.g., a magnetic sensing value, an acceleration sensing value, and/or a gyro sensing value) acquired within the radius related to the particular area or path according to a designated time period, based on a change in the magnitude of acceleration of the electronic device 101 in a first direction (e.g., the direction of gravity) and a change in the magnitude of acceleration of the electronic device 101 in a second direction (e.g., the direction perpendicular to the direction of gravity). For example, when the acceleration sensing value of the electronic device 101 in the first direction indicates repeated patterns having a first size (e.g., 1210 of FIG. 12)

and a second size (e.g., 1220 of FIG. 12) and the acceleration sensing value of the electronic device 101 in the second direction indicates a second size change (e.g., the second size change 1320 of FIG. 13) (or when a second posture of the electronic device 101 is determined according to the second size change of the acceleration sensing value), the processor 120 may combine, as a single piece of data, multiple pieces of data acquired while the amount of a change in the location of the electronic device 101 in relation to the movement of the user is less than a designated size (e.g., in an interval in which the electronic device 101 stops or an interval of stopping (1610 of FIG. 16A)).

Referring to FIG. 17, when the amount of the change in the location of the electronic device 101 is less than the designated size, the processor 120 may determine that the electronic device 101 has stopped at the same or similar position (or stopping 1610 is performed), and combine, as a single piece of data, multiple pieces of data (e.g., data 1 to data 11, or data 20 to data 30) acquired during the stop. For example, the processor 120 may acquire average data of the multiple pieces of data, and determine the average data as the single piece of data. In another example, the processor 120 may identify data having a maximum value or a minimum value among the multiple pieces of data, and determine the corresponding data as the single piece of data.

In an embodiment, the processor 120 may spatially and equally arrange, in a particular area 1710 or path in which a virtual marker is defined, the single piece of data (e.g., the average data, the maximum data, or the minimum data) determined from among multiple pieces of data (e.g., data 1 to data 11 or data 20 to data 30) and the multiple pieces of data (e.g., data 12 to data 19) acquired while the electronic device 101 moves to the changing locations (or while the location change amount is equal to or greater than the designated size).

Figure 18:
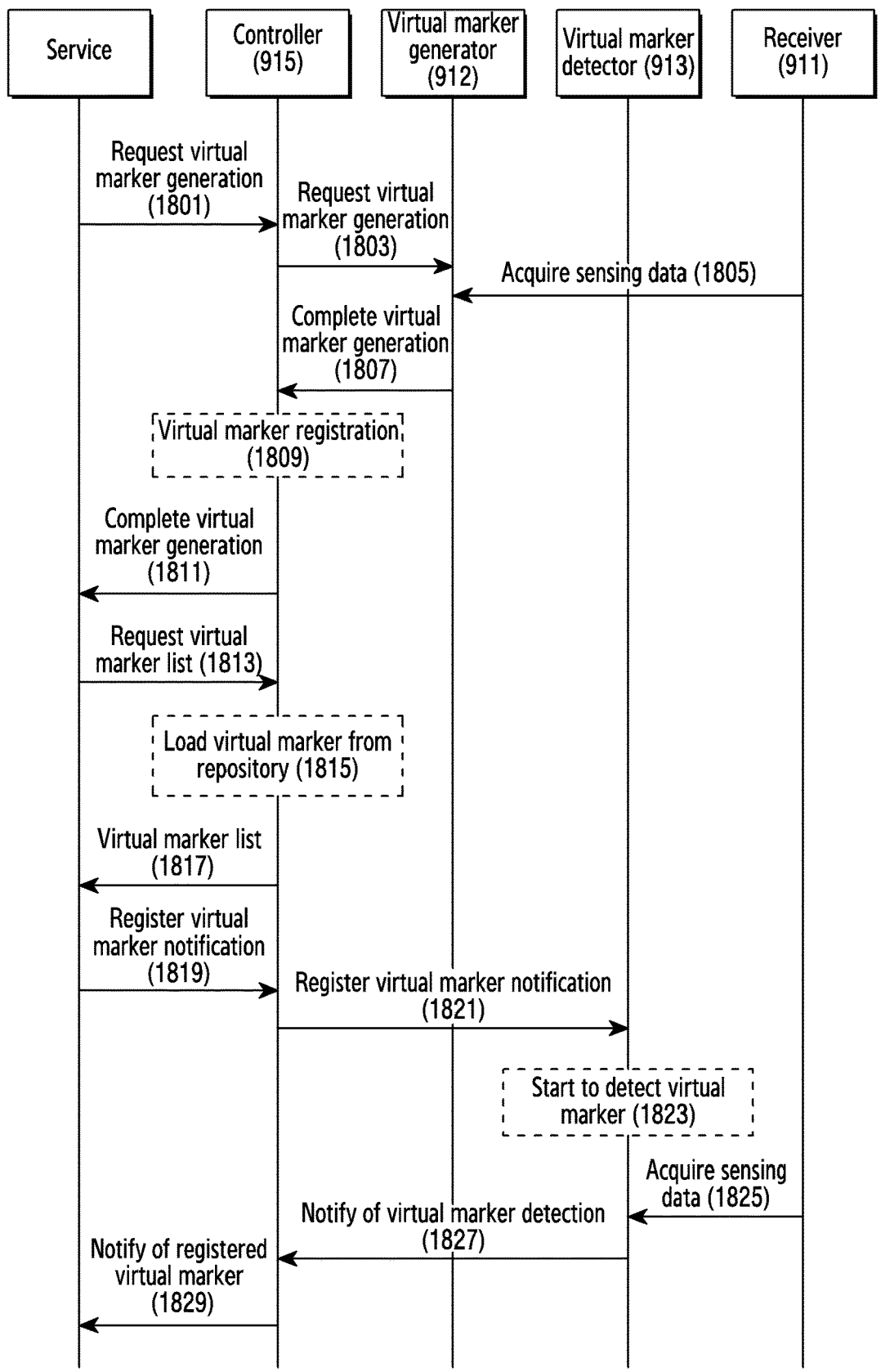
FIG. 18 illustrates a process of determining the location of an electronic device according to an embodiment of the disclosure.

FIG. 18 illustrates a process of determining the location of an electronic device according to an embodiment of the disclosure.

Referring to FIG. 2, a processor (e.g., the processor 120 of FIG. 1) of an electronic device (e.g., the electronic device 101 of FIG. 1) may perform an operation of the virtual marker detection 260. The processor 120 may identify whether the electronic device 101 has entered (or is located in) a particular area and/or path by comparing a measured sensing value (e.g., a magnetic sensing value, an acceleration sensing value, and/or a gyro sensing value) with sensing data of a virtual marker defined for the particular area and/or path. The processor 120 may provide a designated service when the level of similarity obtained through comparison between with sensing data of the virtual marker and a corrected sensing value (e.g., a determined number of consecutive sensing values some integrated sensing values for spatial arrangement in the particular area and/or path) after real-time measurement is equal to or greater than a designated level. For example, when a predetermined virtual marker (e.g., data acquired within the radius having a designated size with reference to a particular area and/or path) is similar to a virtual marker defined for the particular area and/or path, the processor 120 may configure the electronic device 101 to execute an event designated to be performed in the particular area and/or path, or request a designated service.

Referring to FIG. 18, in the process of determining the location of the electronic device 101 for the execution of the event and the request for the service, in operation 1801, a service (e.g., the service 930 of FIG. 9) may request generation of a virtual marker (e.g., the virtual marker 810 of FIG. 8) from a controller (e.g., the controller 915 of FIG. 9). In operation 1803, the controller 915 may request generation of the virtual marker 810 from a virtual marker generator (e.g., the virtual marker generator 912 of FIG. 9).

In operation 1805, a receiver (e.g., the receiver 911 of FIG. 9) may acquire sensing data and transfer the same to the virtual marker generator 912. The virtual marker generator 912 may generate the virtual marker 810. For example, the virtual marker generator 912 may generate a virtual marker indicating a current location of an electronic device (e.g., the electronic device 101 of FIG. 1) (or a virtual marker indicating an area where the electronic device 101 is located). In operation 1807, the virtual marker generator 912 may notify the controller 915 of the completion of the generation of the virtual marker 810. In operation 1809, the controller 915 may register the virtual marker 810 in a storage (e.g., the storage 914 of FIG. 9). In operation 1811, the controller 915 may notify the service 930 of the completion of the generation of the virtual marker 810.

In operation 1813, the service 930 may request a virtual marker list from the controller 915. In operation 1815, the controller 915 may load the virtual marker 810 from a repository (e.g., the virtual marker local repository 840 and/or the virtual marker remote repository 850 of FIG. 8). In operation 1817, the controller 915 may transfer the virtual marker list to the service 930.

In operation 1819, the service 930 may request registration of a virtual marker notification from the controller 915. The virtual marker notification may include, for example, information of requesting to start detecting the virtual marker in a virtual marker platform (e.g., the virtual marker platform 910 of FIG. 9). In operation 1821, the controller 915 may transfer the generation of the virtual marker notification to the virtual marker detector (e.g., the virtual marker detector 913 of FIG. 9). In operation 1823, the virtual marker detector 913 may start to detect the virtual marker. In operation 1825, the receiver 911 may acquire the sensing data and transfer the same to the virtual marker detector 913. In operation 1827, the virtual marker detector 913 may notify the controller 915 of the detection of the virtual marker when the acquired sensing data corresponds to a virtual marker registered in the virtual marker list. In operation 1829, the controller 915 may notify the service 930 of the registered virtual marker. For example, the controller 915 may notify that the electronic device 101 has entered an area and/or path corresponding to the registered virtual marker.

According to various embodiments, the execution of the event, based on the determination of the location of the electronic device 101 may be associated with a vehicle. For example, when a virtual marker of a peripheral area of an audio system, a dashboard, or center fascia included in a designated vehicle is registered in the electronic device 101 and the location of the electronic device 101 is determined as the peripheral area of the audio system, the dashboard, or the center fascia, the processor 120 may execute an event corresponding to the virtual marker (e.g., execute a music application or execute a navigation application). In relation to this, a service (e.g., the service 930 of FIG. 9) of the electronic device 101 may request, from a controller (e.g., the controller 915 of FIG. 9) generation of the virtual marker for the peripheral area of the audio system, the dashboard, or the center fascia, and the controller 915 may request the generation of the virtual marker from a virtual marker generator (e.g., the virtual marker generator 912 of FIG. 9). In this operation, the virtual marker generator 912 may request, from the controller 915, collection of sensing data of the peripheral area to acquire the sensing data of the peripheral area surrounding the audio system, the dashboard, or the center fascia (or the peripheral area within a designated area range with reference to the audio system, the dashboard, or the center fascia) from a receiver (e.g., the receiver 911 of FIG. 9). The controller 915 may output a message (e.g., a message based on audio, text, an image, or a combination thereof) requesting the collection of the sensing data so as to request collection of the sensing data of the peripheral area from a user by using the electronic device 101.

According to various embodiments, event execution based on the determination of the location of the electronic device 101 may be associated with an advertisement service. For example, when a shared marker of a peripheral area of a particular area (e.g., a display stand for goods or a checkout counter) included in a designated offline market is registered in the electronic device 101 and the location of the electronic device 101 is determined as the peripheral area of the particular object included in the offline market, the processor 120 may execute an event corresponding to the shared marker (e.g., receive goods information or marketing information (advertisement) from an external electronic device and output the same through audio, text, an image, or a combination thereof). In relation to this, the processor 120 of the electronic device 101 may acquire the shared marker of the peripheral area of the particular object registered in a virtual marker remote repository (e.g., the virtual marker remote repository 850 of FIG. 8) by the external electronic device, and register the acquired shared marker in a virtual marker local repository (e.g., the virtual marker local repository 840 of FIG. 8). In an embodiment, the processor 120 may determine that the electronic device 101 is located in the peripheral area of the particular object included in the designated offline marker, based on the shared marker, and in this case, may acquire information (e.g., goods information and marketing information) related to the execution of the event through interaction with the external electronic device which has generated the shared marker.

Figure 19:
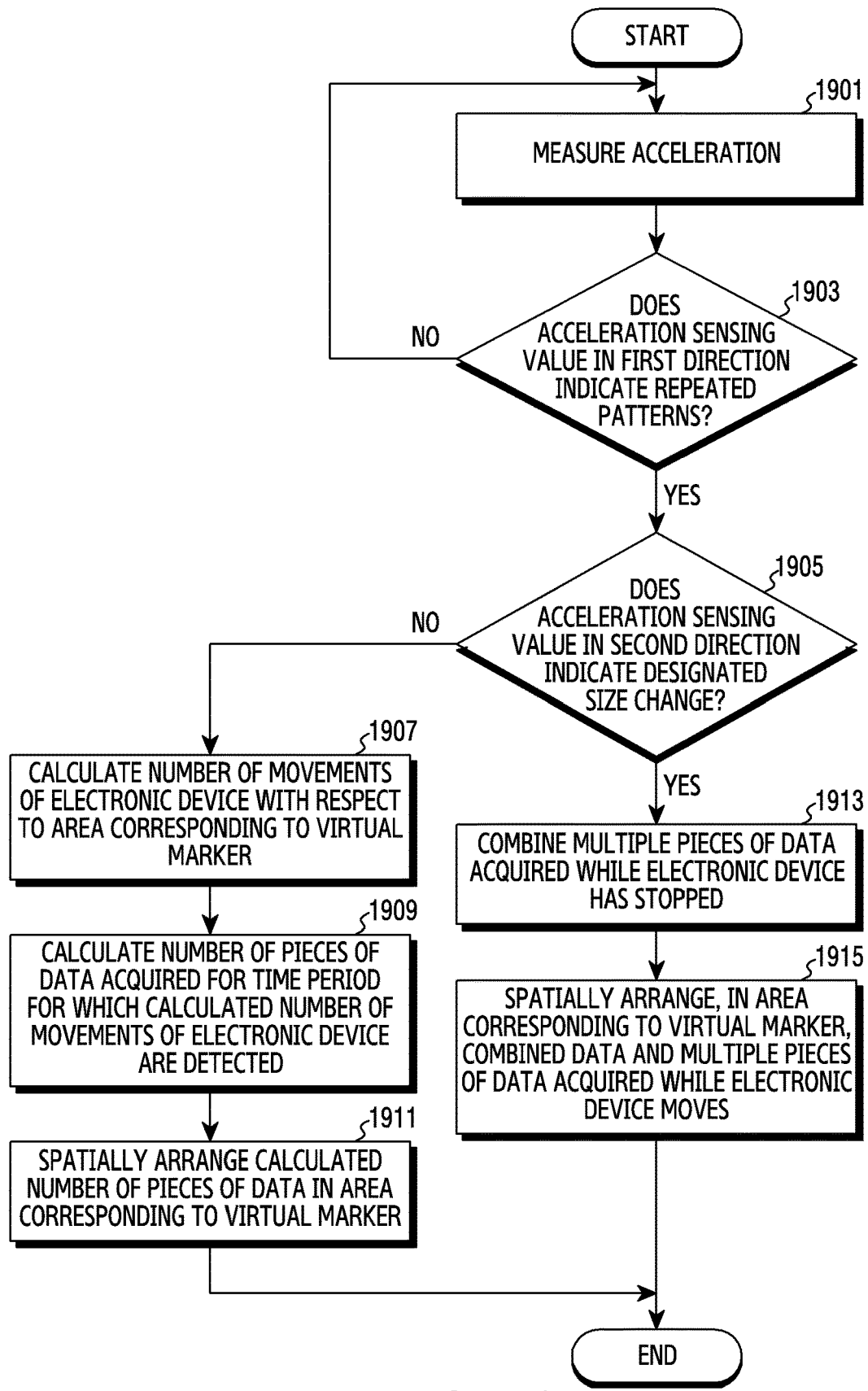
FIG. 19 illustrates a method for processing data used for location determination of an electronic device according to an embodiment of the disclosure.

FIG. 19 illustrates a method for processing data used for location determination of an electronic device according to an embodiment of the disclosure.

Referring to FIG. 19, in operation 1901, a processor (e.g., the processor 120 of FIG. 1) of an electronic device (e.g., the electronic device 101 of FIG. 1) may measure acceleration of the electronic device 101 by using an acceleration sensor included in a sensor module (e.g., the sensor module 176 of FIG. 1). For example, the processor 120 may acquire an acceleration sensing value of the electronic device 101 in a first direction (e.g., the direction of gravity) and an acceleration sensing value of the electronic device 101 in a second direction (e.g., the direction perpendicular to the direction of gravity) according to a designated time period within the radius related to a particular area (or path) in which a virtual marker is configured (or registered).

In operation 1903, the processor 120 may determine whether the acceleration sensing value of the electronic device 101 in the first direction indicates repeated patterns. For example, the processor 120 may identify whether the acceleration sensing value of the electronic device 101 in the first direction indicates repeated patterns having a first size and a second size that is relatively greater than the first size.

According to an embodiment, an acceleration sensing value measured when a user carrying the electronic device 101 stops (e.g., in a state where feet are in contact with the ground) may indicate a first size, and an acceleration sensing value measured when the user moves (e.g., in a state where one foot is in contact with the ground) may indicate a second size that is relatively greater than the first size. In an embodiment, when the acceleration sensing value of the electronic device 101 in the first direction indicates repeated patterns having the first size and the second size, the processor 120 may determine that movement of the electronic device 101 is generated as the user carrying the electronic device 101 moves. According to an embodiment, the processor 120 may determine an average distance of one movement of the user (e.g., the user's step), based on a time range in which the acceleration sensing value having the second size is maintained with the size equal to or greater than a designated threshold size.

In an embodiment, when the acceleration sensing value of the electronic device 101 in the first direction indicates repeated patterns having the first size and the second size, the processor 120 may determine, in operation 1905, whether the acceleration sensing value of the electronic device 101 in the second direction indicates a change having a designated size.

According to an embodiment, when the electronic device 101 has a first posture (e.g., accommodated in clothing or belongings) by the user, the acceleration sensing value of the electronic device 101 in the second direction may indicate a first size change that is substantially minor (or less than a designated change amount). In an embodiment, when the electronic device 101 has a second posture (e.g., held by the user's body (hand)) by the user, the acceleration sensing value of the electronic device 101 in the second direction may indicate a second size change which is distinguished from the first size change (which is greater than the first size change, or is equal to or greater than a designated change amount), based on repeated movements of the user's body (e.g., arm swing). When the acceleration sensing value of the electronic device 101 in the second direction indicates the second size change, the processor 120 may determine that the acceleration sensing value of the electronic device 101 in the second direction indicates a change having a designated size.

When the acceleration sensing value of the electronic device 101 in the second direction does not indicate the designated size change (or does not indicate the second size change or indicates the first size change) in operation 1905, the processor 120 may calculate, in operation 1907, the number of times that the movement of the electronic device 101 may occur in a particular area (or path) in which the virtual marker is configured. In this operation, the processor 120 may determine a first posture of the electronic device according to the acceleration sensing value of the electronic device 101 in the second direction, which does not indicate the designated size change.

In an embodiment, the processor 120 may determine, as one movement of the electronic device 101, one movement of a user carrying the electronic device 101 (e.g., an operation in which one foot in a state of being in contact with the ground is taken off from the ground, and then comes into contact with the ground again). The processor 120 may compare the average distance of one movement of the user, determined in operation 1903, with the size (or the length) of a particular area (or path) in which the virtual marker is configured, so as to calculate, based on the comparison, the number of movements that the user can make with respect to the particular area, and the number of movements of the electronic device 101, which corresponds to the number of movements of the user.

In operation 1909, the processor 120 may calculate (or determine) the number of pieces of data acquired for a time period for which the calculated number of movements of the electronic device 101 are detected in the particular area (or path) in which the virtual marker is configured.

In operation 1911, the processor 120 may arrange spatially and equally at least one of the calculated number of pieces of data in the particular area (or path) in which the virtual marker is configured. The processor 120 may compare the at least one arranged piece of data with multiple pieces of data included in the virtual marker defined in the particular area. In an embodiment, when the level of similarity between at least a part of the at least one arranged piece of data and the multiple pieces of data included in the virtual marker is equal to or greater than a designated level, the processor 120 may determine that the electronic device 101 is located in the particular area, and execute an event corresponding to the virtual marker defined in the particular area or provide a service.

When the acceleration sensing value of the electronic device 101 indicates the designated size change (e.g., or indicates the second size change) in operation 1905, the processor may 120 may combine, in operation 1913, multiple pieces of data acquired while the electronic device 101 stops within the particular area (or path) in which the virtual marker is defined. In this operation, the processor 120 may determine a second posture of the electronic device as the acceleration sensing value of the electronic device 101 in the second direction indicates the designated size change.

In an embodiment, in relation to the movement of the user carrying the electronic device 101, when the location change amount of the electronic device 101 is determined to be a value smaller than a designated size, the processor 120 may determine that the electronic device 101 has stopped at the same or similar position for a predetermined time by arm swing according to the movement of the user. While the electronic device 101 has stopped, the processor 120 may acquire multiple pieces of data according to a time period related to data measurement, and combine the multiple pieces of data into a single piece of data. For example, the processor 120 may calculate average data of the multiple pieces of data and determine the average data as the single piece of data. In another example, the processor 120 may identify data having a maximum value or a minimum value, among the multiple pieces of data, and determine the corresponding data as the single piece of data.

In operation 1915, the processor 120 may arrange spatially and equally the multiple pieces of data with respect to the particular area (or path) in which the virtual marker is defined. In relation to this, the processor 120 may acquire multiple pieces of data according to a designated time period related to data acquisition while the location of the electronic device 101 changes by arm swing according to the movement of the user and the location change amount has a value equal to or greater than the designated size. In an embodiment, the processor 120 may spatially and equally arrange the acquired multiple pieces of data or the combined single piece of data in the particular area (or path) in which the virtual marker is defined.

In an embodiment, when the level of similarity between the at least a part of the pieces of data arranged in the particular area and at least a part of the multiple pieces of data included in the virtual marker defined in the particular area is equal to or greater than a designated level, the processor 120 may determine that the electronic device 101 is located in the particular area, and execute an event corresponding to the virtual marker defined in the particular area or provide a service.

An electronic device according to the above-described various embodiments may include a magnetic sensor, an acceleration sensor, and a processor operatively connected to the magnetic sensor and the acceleration sensor.

According to various embodiments, the processor may acquire multiple pieces of first magnetic data by using the magnetic sensor in a first area where the electronic device is located, generate a virtual marker corresponding to the first area by using the multiple pieces of first magnetic data, determine a movement of the electronic device, based on multiple pieces of first acceleration data in a first direction, the data being acquired by using the acceleration sensor, determine a posture of the electronic device, based on multiple pieces of second acceleration data in a second direction that is perpendicular to the first direction, the data being acquired by using the acceleration sensor, and determine, based on at least one of the movement of the electronic device and the posture of the electronic device, multiple pieces of third magnetic data to be used for comparison with the virtual marker, among multiple pieces of second magnetic data acquired within a designated radius with reference to the first area by using the magnetic sensor.

According to various embodiments, the processor may determine that the movement of the electronic device includes a movement in the first direction in case that the multiple pieces of first acceleration data show patterns of a first size with respect to the first direction and a pattern of a second size between every pair of consecutive first-size patterns of the first-size patterns, the second size being greater than the first size.

According to various embodiments, the processor may determine a first posture of the electronic device in a state in which the electronic device is not held by a user body if the multiple pieces of second acceleration data indicate a first size change having a change amount less than a designated first change amount with respect to the second direction.

According to various embodiments, the processor may compare a size of the first area and an average time of the second-size pattern of the first acceleration data if the first posture of the electronic device is determined, so as to calculate a number of movements of the electronic device in the first area.

According to various embodiments, the processor may determine, as the multiple pieces of third magnetic data, multiple pieces of magnetic data acquired while the calculated number of movements of the electronic device occur, among the multiple pieces of second magnetic data.

According to various embodiments, the processor may determine that the electronic device is located in the first area if a level of similarity between at least a part of the multiple pieces of third magnetic data and at least a part of the multiple pieces of first magnetic data included in the virtual marker, is equal to or greater than a designated level.

According to various embodiments, the processor may determine a second posture of the electronic device in a state in which the electronic device is held by a user body if the multiple pieces of second acceleration data indicate a second size change having a change amount equal to or greater than a designated second change amount with respect to the second direction.

According to various embodiments, the processor may determine a single piece of data from multiple pieces of data acquired while the electronic device indicates a location change having a change amount less than a designated third change amount, among the multiple pieces of second magnetic data if the second posture of the electronic device is determined.

According to various embodiments, the processor may determine an average of the multiple pieces of data as the single piece of data, or determine a maximum value or a minimum value of the multiple pieces of data as the single piece of data.

According to various embodiments, the processor may determine that the electronic device is located in the first area if a level of similarity between at least a part of the multiple pieces of first magnetic data included in the virtual marker and at least a part of the single piece of data and the multiple pieces of data acquired while the electronic device indicates the location change having a change amount equal to or greater than the third change amount, among the multiple pieces of second magnetic data, is equal to or greater than a designated level.

A method for processing data used for location determination of an electronic device according to the above-described various embodiments may include acquiring multiple pieces of first magnetic data by using a magnetic sensor in a first area where the electronic device is located, generating a virtual marker corresponding to the first area by using the multiple pieces of first magnetic data, determining a movement of the electronic device, based on multiple pieces of first acceleration data in a first direction, the data being acquired by using an acceleration sensor, determining a posture of the electronic device, based on multiple pieces of second acceleration data in a second direction that is perpendicular to the first direction, the data being acquired by using the acceleration sensor, and determining, based on at least one of the movement of the electronic device and the posture of the electronic device, multiple pieces of third magnetic data to be used for comparison with the virtual marker, among multiple pieces of second magnetic data acquired within a designated radius with reference to the first area by using the magnetic sensor.

According to various embodiments, the determining of the movement of the electronic device may include determining that there is the movement of the electronic device in the first direction in case that the multiple pieces of first acceleration data show patterns of a first size with respect to the first direction and a pattern of a second size every between the first-size patterns, the second size being greater than the first size.

According to various embodiments, the determining of the posture of the electronic device may include determining a first posture of the electronic device in a state in which the electronic device is not held by a user body if the multiple pieces of second acceleration data indicate a first size change having a change amount less than a designated first change amount with respect to the second direction.

According to various embodiments, the determining of the posture of the electronic device may include comparing a size of the first area and an average time of the second-size patterns of the first acceleration data if the first posture of the electronic device is determined, so as to calculate a number of movements of the electronic device in the first area.

According to various embodiments, the determining of the multiple pieces of third magnetic data may include determining, as the multiple pieces of third magnetic data, multiple pieces of magnetic data acquired while the calculated number of movements of the electronic device occur, among the multiple pieces of second magnetic data.

According to various embodiments, the method for processing data used for location determination may further include determining that the electronic device is located in the first area if a level of similarity between at least a part of the multiple pieces of first magnetic data included in the virtual marker and at least a part of the multiple pieces of third magnetic data, is equal to or greater than a designated level.

According to various embodiments, the determining of the posture of the electronic device may include determining a second posture of the electronic device in a state in which the electronic device is held by a user body if the multiple pieces of second acceleration data indicate a second size change having a change amount equal to or greater than a designated second change amount with respect to the second direction.

According to various embodiments, the determining of the posture of the electronic device may include determining a single piece of data from multiple pieces of data acquired while the electronic device indicates a location change having a change amount less than a designated third change amount, among the multiple pieces of second magnetic data if the second posture of the electronic device is determined.

According to various embodiments, the determining of the single piece of data may include at least one of determining an average of the multiple pieces of data as the single piece of data, and determining a maximum value or a minimum value of the multiple pieces of data as the single piece of data.

According to various embodiments, the method for processing data used for location determination may further include determining that the electronic device is located in the first area if a level of similarity between at least a part of the multiple pieces of first magnetic data included in the virtual marker and at least a part of the single piece of data and the multiple pieces of data acquired while the electronic device indicates the location change having a change amount equal to or greater than the third change amount, among the multiple pieces of second magnetic data, is equal to or greater than a designated level.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a magnetic sensor;
an acceleration sensor; and
a processor operatively connected to the magnetic sensor and the acceleration sensor,
wherein the processor is configured to:
acquire multiple pieces of first magnetic data by using the magnetic sensor in a first area where the electronic device is located,
generate a virtual marker corresponding to the first area by using the multiple pieces of first magnetic data,
determine a movement of the electronic device, based on multiple pieces of first acceleration data in a first direction, the data being acquired by using the acceleration sensor,
determine a posture of the electronic device, based on multiple pieces of second acceleration data in a second direction that is perpendicular to the first direction, the data being acquired by using the acceleration sensor, and
determine, based on at least one of the movement of the electronic device and the posture of the electronic device, multiple pieces of third magnetic data to be used for comparison with the virtual marker, among multiple pieces of second magnetic data acquired within a designated radius with reference to the first area by using the magnetic sensor.

2. The electronic device of claim 1, wherein the processor is further configured to, in case that the multiple pieces of first acceleration data show patterns of a first size with respect to the first direction and a pattern of a second size between every pair of consecutive first-size patterns of the first-size patterns, the second size being greater than the first size, determine that the movement of the electronic device includes a movement in the first direction.

3. The electronic device of claim 2, wherein the processor is further configured to determine a first posture of the electronic device in a state in which the electronic device is not held by a user body if the multiple pieces of second acceleration data indicate a first size change having a change amount less than a designated first change amount with respect to the second direction.

4. The electronic device of claim 3, wherein the processor is further configured to:
compare a size of the first area and an average time of the second-size pattern of the first acceleration data if the first posture of the electronic device is determined, and
calculate a number of movements of the electronic device in the first area.

5. The electronic device of claim 4, wherein the processor is further configured to determine, as the multiple pieces of third magnetic data, multiple pieces of magnetic data acquired while the calculated number of movements of the electronic device occur, among the multiple pieces of second magnetic data.

6. The electronic device of claim 2, wherein the processor is further configured to determine a second posture of the electronic device in a state in which the electronic device is held by a user body if the multiple pieces of second acceleration data indicate a second size change having a change amount equal to or greater than a designated second change amount with respect to the second direction.

7. The electronic device of claim 6, wherein the processor is further configured to determine a single piece of data from multiple pieces of data acquired while the electronic device indicates a location change having a change amount less than a designated third change amount, among the multiple pieces of second magnetic data if the second posture of the electronic device is determined.

8. The electronic device of claim 7, wherein the processor is further configured to determine that the electronic device is located in the first area if a level of similarity between at least a part of the multiple pieces of first magnetic data included in the virtual marker and at least a part of the single piece of data and the multiple pieces of data acquired while the electronic device indicates the location change having a change amount equal to or greater than the third change amount, among the multiple pieces of second magnetic data, is equal to or greater than a designated level.

9. A method for processing data used for location determination of an electronic device, the method comprising:
acquiring multiple pieces of first magnetic data by using a magnetic sensor in a first area where the electronic device is located;
generating a virtual marker corresponding to the first area by using the multiple pieces of first magnetic data;
determining a movement of the electronic device, based on multiple pieces of first acceleration data in a first direction, the data being acquired by using an acceleration sensor;
determining a posture of the electronic device, based on multiple pieces of second acceleration data in a second direction that is perpendicular to the first direction, the data being acquired by using the acceleration sensor; and
determining, based on at least one of the movement of the electronic device and the posture of the electronic device, multiple pieces of third magnetic data to be used for comparison with the virtual marker, among multiple pieces of second magnetic data acquired within a designated radius with reference to the first area by using the magnetic sensor.

10. The method of claim 9, wherein the determining of the movement of the electronic device comprises determining that the movement of the electronic device includes a movement in the first direction in case that the multiple pieces of first acceleration data show patterns of a first size with respect to the first direction and a pattern of a second size between every pair of consecutive first-size patterns of the first-size patterns, the second size being greater than the first size.

11. The method of claim 10, wherein the determining of the posture of the electronic device comprises determining a first posture of the electronic device in a state in which the electronic device is not held by a user body if the multiple pieces of second acceleration data indicate a first size change having a change amount less than a designated first change amount with respect to the second direction.

12. The method of claim 11, wherein the determining of the posture of the electronic device further comprises:
comparing a size of the first area and an average time of the second-size pattern of the first acceleration data if the first posture of the electronic device is determined; and
calculate a number of movements of the electronic device in the first area.

13. The method of claim 12, wherein the determining of the multiple pieces of third magnetic data comprises determining, as the multiple pieces of third magnetic data, multiple pieces of magnetic data acquired while the calculated number of movements of the electronic device occur, among the multiple pieces of second magnetic data.

14. The method of claim 10, wherein the determining of the posture of the electronic device comprises determining a second posture of the electronic device in a state in which the electronic device is held by a user body if the multiple pieces of second acceleration data indicate a second size change having a change amount equal to or greater than a designated second change amount with respect to the second direction.

15. The method of claim 14, wherein the determining of the posture of the electronic device comprises determining a single piece of data from multiple pieces of data acquired while the electronic device indicates a location change having a change amount less than a designated third change amount, among the multiple pieces of second magnetic data if the second posture of the electronic device is determined.

16. The electronic device of claim 5, wherein the processor is further configured to determine that the electronic device is located in the first area if a level of similarity between at least a part of the multiple pieces of third magnetic data and at least a part of the multiple pieces of first magnetic data included in the virtual marker, is equal to or greater than a designated level.

17. The electronic device of claim 7, wherein the processor is further configured to determine an average of the multiple pieces of data as the single piece of data, or determine a maximum value or a minimum value of the multiple pieces of data as the single piece of data.

18. The method of claim 13, wherein the method further comprises determining that the electronic device is located in the first area if a level of similarity between at least a part of the multiple pieces of first magnetic data included in the virtual marker and at least a part of the multiple pieces of third magnetic data, is equal to or greater than a designated level.

19. The method of claim 15, wherein the determining of the single piece of data comprises at least one of determining an average of the multiple pieces of data as the single piece of data, and determining a maximum value or a minimum value of the multiple pieces of data as the single piece of data.

20. The method of claim 15, wherein the method further comprises determining that the electronic device is located in the first area if a level of similarity between at least a part of the multiple pieces of first magnetic data included in the virtual marker and at least a part of the single piece of data and the multiple pieces of data acquired while the electronic device indicates the location change having a change amount equal to or greater than the third change amount, among the multiple pieces of second magnetic data, is equal to or greater than a designated level.

* * * * *